United States Patent
Woo et al.

(10) Patent No.: US 12,171,078 B2
(45) Date of Patent: Dec. 17, 2024

(54) ELECTRONIC DEVICE INCLUDING FLEXIBLE PRINTED CIRCUIT BOARD

(71) Applicant: Samsung Electronics Co., Ltd., Suwon-si (KR)

(72) Inventors: Jeong Woo, Suwon-si (KR); Youngsun Lee, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 188 days.

(21) Appl. No.: 18/073,127

(22) Filed: Dec. 1, 2022

(65) Prior Publication Data

US 2023/0189463 A1     Jun. 15, 2023

Related U.S. Application Data

(63) Continuation of application No. PCT/KR2022/016951, filed on Nov. 2, 2022.

(30) Foreign Application Priority Data

Dec. 10, 2021  (KR) .................. 10-2021-0176362
Dec. 29, 2021  (KR) .................. 10-2021-0190840

(51) Int. Cl.
    *H05K 5/02*         (2006.01)
    *H05K 5/06*         (2006.01)

(52) U.S. Cl.
    CPC .......... *H05K 5/0247* (2013.01); *H05K 5/0226* (2013.01); *H05K 5/06* (2013.01)

(58) Field of Classification Search
    CPC ....... H05K 5/0247; H05K 5/0226; H05K 5/06
    USPC ....................................................... 361/749
    See application file for complete search history.

(56) References Cited

U.S. PATENT DOCUMENTS

| 2003/0211873 | A1 | 11/2003 | Komiyama |
| 2018/0211091 | A1* | 7/2018 | Hsu .................. H05K 5/06 |
| 2020/0351393 | A1 | 11/2020 | Kang et al. |

(Continued)

FOREIGN PATENT DOCUMENTS

| JP | 4880018 B2 | 2/2012 |
| JP | 5423947 B2 | 2/2014 |
| JP | 5598961 B2 | 10/2014 |

(Continued)

OTHER PUBLICATIONS

International Search Report dated on Feb. 14, 2023, issued in International Application No. PCT/KR2022/016951.

*Primary Examiner* — Andargie M Aychillhum
(74) *Attorney, Agent, or Firm* — Jefferson IP Law, LLP

(57) ABSTRACT

An electronic device is provided. The electronic device includes a display including a first area and a second area, a first housing supporting the first area and forming a first space on a rear surface of the first area, a second housing supporting the second area and forming a second space on a rear surface of the second area, a hinge structure connecting the first housing and the second housing to be foldable around a folding axis, a first bracket connecting the first housing and the hinge structure and having a first opening penetrating through a surface thereof, a second bracket connecting the second housing and the hinge structure and having a second opening penetrating through a surface thereof, and an FPCB extending from the first space to the second space across the folding axis in an extension direction.

20 Claims, 18 Drawing Sheets

(56) References Cited

U.S. PATENT DOCUMENTS

2020/0383225 A1* 12/2020 Satou .................. H05K 5/06

FOREIGN PATENT DOCUMENTS

| KR | 10-2016-0024151 A | 3/2016 |
| KR | 10-2020-0046628 A | 5/2020 |
| KR | 10-2020-0057236 A | 5/2020 |

* cited by examiner

ELECTRONIC DEVICE INCLUDING FLEXIBLE PRINTED CIRCUIT BOARD

CROSS-REFERENCE TO RELATED APPLICATION(S)

This application is a continuation application, claiming priority under § 365 (c), of an International application No. PCT/KR2022/016951, filed on Nov. 2, 2022, which is based on and claims the benefit of a Korean patent application number 10-2021-0176362, filed on Dec. 10, 2021, in the Korean Intellectual Property Office, and of a Korean patent application number 10-2021-0190840, filed on Dec. 29, 2021, in the Korean Intellectual Property Office, the disclosure of each of which is incorporated by reference herein in its entirety.

BACKGROUND

1. Field

The disclosure relates to an electronic device including a flexible printed circuit board (FPCB).

2. Description of Related Art

Recently, electronic devices such as portable terminals are under development to improve the convenience of use with the reduced size while having various functions to satisfy consumers' purchasing needs. Thus, various components and boards for such various functions may be provided inside an electronic device and may be connected through a flexible printed circuit board (FPCB) in the electronic device.

The above information is presented as background information only to assist with an understanding of the disclosure. No determination has been made, and no assertion is made, as to whether any of the above might be applicable as prior art with regard to the disclosure.

SUMMARY

It is required that electronic devices be reduced in size to improve their portability and aesthetic effects. Since various components are provided inside an electronic device, technologies for effective use of an internal space of a small electronic device are under development. For example, a flexible printed circuit board (FPCB) may be used to electrically connect components arranged at different positions in an electronic device.

When using the FPCB to connect the components in the electronic device, it is necessary to prevent water from flowing into the electronic device through the FPCB.

Aspects of the disclosure are to address at least the above-mentioned problems and/or disadvantages and to provide at least the advantages described below. Accordingly, an aspect of the disclosure is to provide an electronic device including an FPCB.

An aspect of the disclosure is to provide the FPCB to which a waterproof structure is applied to secure by itself a waterproof function for an arrangement path of the FPCB.

An aspect of the disclosure is to provide the FPCB having a waterproof performance that is improved as the FPCB is formed to be in a structure in which a plurality of members is connected.

Additional aspects will be set forth in part in the description which follows and, in part, will be apparent from the description, or may be learned by practice of the presented embodiments.

In accordance with an aspect of the disclosure, an electronic device is provided. The electronic device includes a display including a first area and a second area, a first housing supporting the first area and forming a first space on a rear surface of the first area, a second housing supporting the second area and forming a second space on a rear surface of the second area, a hinge structure connecting the first housing and the second housing to be foldable about a folding axis and allowing the first area and the second area to change between a first state in which the first area and the second area form substantially the same plane and a second state in which the first area and the second area face each other, a first bracket connecting the first housing and the hinge structure and having a first opening penetrating through a surface thereof, a second bracket connecting the second housing and the hinge structure and having a second opening penetrating through a surface thereof, and an FPCB extending from the first space to the second space across the folding axis in an extension direction. The FPCB includes a central portion of which at least a portion is arranged on the hinge structure and first and second ends of the central portion respectively extending to the first bracket and the second bracket, a first sealing portion arranged on the surface of the first bracket and sealing the first opening, a second sealing portion arranged on the surface of the second bracket and sealing the second opening, a first extension portion extending to the first space through the first opening, and a second extension portion extending to the second space through the second opening.

In accordance with an aspect of the disclosure, an electronic device is provided. The electronic device includes a display including a first area and a second area. a first housing supporting the first area and forming a first space on a rear surface of the first area, a second housing supporting the second area and forming a second space on a rear surface of the second area, a hinge structure connecting the first housing and the second housing to be foldable about a folding axis and allowing the first area and the second area to change between a first state in which the first area and the second area form substantially a same plane and a second state in which the first area and the second area face each other, a first bracket connecting the first housing and the hinge structure and having a first opening penetrating through a surface thereof, a second bracket connecting the second housing and the hinge structure and having a second opening penetrating through a surface thereof, an FPCB of which at least a portion is arranged between the hinge structure and the display and first and second ends of the FPCB extending to the first space and the second space through the first opening and the second opening, respectively. a first cover member connected to a first sealing portion of the FPCB and the first cover member being arranged between the display and the first bracket to cover the first opening, and a second cover member connected to a second sealing portion of the FPCB and the second cover member being arranged between the display and the second bracket to cover the second opening.

In accordance with an aspect of the disclosure, an electronic device is provided. The electronic device includes a display including a first area and a second area, a first housing including a first surface on which the first area is arranged and a second surface opposite to the first surface, a second housing including a third surface on which the second area is arranged and a fourth surface opposite to the third surface, a hinge structure connecting the first housing and the second housing to be foldable about a folding axis and allowing the first area and the second area to change between a first in which the first area and the second area form substantially the same plane and a second state in which the first area and the second area face each other, a first bracket connecting the first housing and the hinge structure and including a first opening penetrating through a surface thereof, a second bracket connecting the second housing and the hinge structure and including a second opening penetrating through a surface thereof, a first printed circuit board (PCB) arranged between the first bracket and the second surface, a second PCB arranged between the second bracket and the fourth surface, and an FPCB connecting the first PCB and the second PCB. The FPCB includes when the display is viewed in the first state, a base member including a central portion of which at least a portion is arranged between the hinge structure and the display, a first sealing portion connected to the central portion and arranged on the surface of the first bracket to cover the first opening, and a second sealing portion connected to the central portion to be opposite to the first sealing portion and arranged on the surface of the second bracket to cover the second opening, a first connection member connected to the first sealing portion and connected to the first PCB through the first opening, and a second connection member connected to the second sealing portion and connected to the second PCB through the second opening.

According to an embodiment of the disclosure, forming a sealing portion for sealing an opening in a flexible printed circuit board (FPCB) may prevent water inflow through an arrangement path of the FPCB.

According to an embodiment of the disclosure, a sealing portion of an FPCB may be used to cover an opening, and the opening may thereby be sealed without an additional sealing rubber.

According to an embodiments of the disclosure, a cover member connected to an FPCB may be used to close an opening, thereby securing a waterproof function of the opening only with a simple assembling method.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
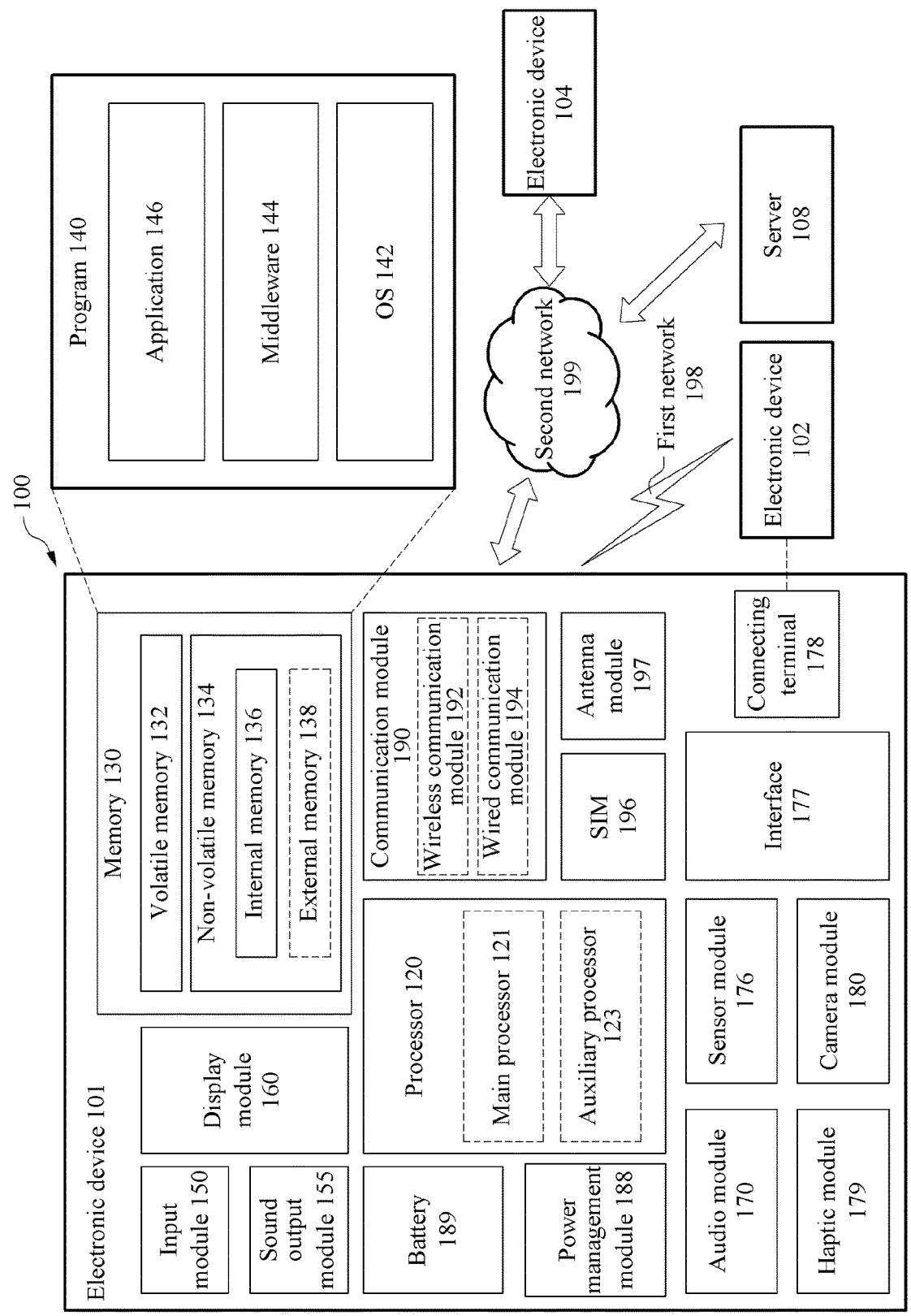
FIG. 1 is a block diagram illustrating an electronic device in a network environment according to an embodiment of the disclosure.

FIG. 1 is a block diagram illustrating an example electronic device in a network environment according to an embodiment of the disclosure.

Referring to FIG. 1, an electronic device 101 in a network environment 100 may communicate with an electronic device 102 via a first network 198 (e.g., a short-range wireless communication network), or communicate with at least one of an electronic device 104 and a server 108 via a second network 199 (e.g., a long-range wireless communication network). The electronic device 101 may communicate with the electronic device 104 via the server 108. The electronic device 101 may include a processor 120, a memory 130, an input module 150, a sound output module 155, a display module 160, an audio module 170, and a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one (e.g., the connecting terminal 178) of the above components may be omitted from the electronic device 101, or one or more other components may be added to the electronic device 101. In some embodiments, some (e.g., the sensor module 176, the camera module 180, or the antenna module 197) of the components may be integrated as a single component (e.g., the display module 160).

The processor 120 may execute, for example, software (e.g., a program 140) to control at least one other component (e.g., a hardware or software component) of the electronic device 101 connected to the processor 120, and may perform various data processing or computation. According to an embodiment, as at least a part of data processing or computation, the processor 120 may store a command or data received from another component (e.g., the sensor module 176 or the communication module 190) in a volatile memory 132, process the command or data stored in the volatile memory 132, and store resulting data in a non-volatile memory 134. The processor 120 may include a main processor 121 (e.g., a central processing unit (CPU) or an application processor (AP)) or an auxiliary processor 123 (e.g., a graphics processing unit (GPU), a neural processing unit (NPU), an image signal processor (ISP), a sensor hub processor, or a communication processor (CP)) that is operable independently from or in conjunction with, the main processor 121. For example, when the electronic device 101 includes the main processor 121 and the auxiliary processor 123, the auxiliary processor 123 may be adapted to consume less power than the main processor 121 or to be specific to a specified function. The auxiliary processor 123 may be implemented separately from the main processor 121 or as a part of the main processor 121.

The auxiliary processor 123 may control at least some of functions or states related to at least one (e.g., the display module 160, the sensor module 176, or the communication module 190) of the components of the electronic device 101, instead of the main processor 121 while the main processor 121 is in an inactive (e.g., sleep) state or along with the main processor 121 while the main processor 121 is an active state (e.g., executing an application). The auxiliary processor 123 (e.g., an ISP or a CP) may be implemented as a portion of another component (e.g., the camera module 180 or the communication module 190) that is functionally related to the auxiliary processor 123. The auxiliary processor 123 (e.g., an NPU) may include a hardware structure specifically for artificial intelligence (AI) model processing. An AI model may be generated by machine learning. The learning may be performed by, for example, the electronic device 101, in which the AI model is performed, or performed via a separate server (e.g., the server 108). Learning algorithms may include, but are not limited to, for example, supervised learning, unsupervised learning, semi-supervised learning, or reinforcement learning. The AI model may include a plurality of artificial neural network layers. An artificial neural network may include, for example, a deep neural network (DNN), a convolutional neural network (CNN), a recurrent neural network (RNN), a restricted Boltzmann machine (RBM), a deep belief network (DBN), and a bidirectional recurrent deep neural network (BRDNN), a deep Q-network, or a combination of two or more thereof, but is not limited thereto. The AI model may alternatively or additionally include a software structure other than the hardware structure.

The memory 130 may store various pieces of data used by at least one component (e.g., the processor 120 or the sensor module 176) of the electronic device 101. The various pieces of data may include, for example, software (e.g., the program 140) and input data or output data for a command related thereto. The memory 130 may include the volatile memory 132 or the non-volatile memory 134. The non-volatile memory 134 may include an internal memory 136 and an external memory 138.

The program 140 may be stored as software in the memory 130 and may include, for example, an operating system (OS) 142, middleware 144, or an application 146.

The input module 150 may receive, from outside (e.g., a user) the electronic device 101, a command or data to be used by another component (e.g., the processor 120) of the electronic device 101. The input module 150 may include, for example, a microphone, a mouse, a keyboard, a key (e.g., a button), or a digital pen (e.g., a stylus pen).

The sound output module 155 may output a sound signal to the outside of the electronic device 101. The sound output module 155 may include, for example, a speaker or a receiver. The speaker may be used for general purposes, such as playing multimedia or playing a recording. The receiver may be used to receive an incoming call. The receiver may be implemented separately from the speaker or as a part of the speaker.

The display module 160 may visually provide information to the outside (e.g., a user) of the electronic device 101. The display module 160 may include, for example, a display, a hologram device, or a projector, and a control circuitry to control its corresponding one of the displays, the hologram device, and the projector. The display module 160 may include a touch sensor adapted to sense a touch, or a pressure sensor adapted to measure an intensity of a force of the touch.

The audio module 170 may convert sound into an electric signal or vice versa. The audio module 170 may obtain the sound via the input module 150 or output the sound via the sound output module 155 or an external electronic device (e.g., the electronic device 102, such as a speaker or headphones) directly or wirelessly connected to the electronic device 101.

The sensor module 176 may detect an operational state (e.g., power or temperature) of the electronic device 101 or an environmental state (e.g., a state of a user) external to the electronic device 101 and generate an electric signal or data value corresponding to the detected state. The sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used by the electronic device 101 to couple with an external electronic device (e.g., the electronic device 102) directly (e.g., by wire) or wirelessly. The interface 177 may include, for example, a high-definition multimedia interface (HDMI), a universal serial bus (USB) interface, a secure digital (SD) card interface, or an audio interface.

The connecting terminal 178 may include a connector via which the electronic device 101 may physically connect to an external electronic device (e.g., the electronic device 102). The connecting terminal 178 may include, for example, an HDMI connector, a USB connector, an SD card connector, or an audio connector (e.g., a headphones connector).

The haptic module 179 may convert an electric signal into a mechanical stimulus (e.g., a vibration or a movement) or an electrical stimulus, which may be recognized by a user via their tactile sensation or kinesthetic sensation. The haptic module 179 may include, for example, a motor, a piezoelectric element, or an electric stimulator.

The camera module 180 may capture a still image and moving images. The camera module 180 may include one or more lenses, image sensors, ISPs, and flashes.

The power management module 188 may manage power supplied to the electronic device 101. The power management module 188 may be implemented as, for example, at least a part of a power management integrated circuit (PMIC).

The battery 189 may supply power to at least one component of the electronic device 101. The battery 189 may include, for example, a primary cell, which is not rechargeable, a secondary cell, which is rechargeable, or a fuel cell.

The communication module 190 may support establishing a direct (e.g., wired) communication channel or a wireless communication channel between the electronic device 101 and an external electronic device (e.g., the electronic device 102, the electronic device 104, or the server 108) and performing communication via the established communication channel. The communication module 190 may include one or more CPs that are operable independently from the processor 120 (e.g., an AP) and that support direct (e.g., wired) communication or wireless communication. The communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device, for example, the electronic device 104, via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a $5^{th}$ generation (5G) network, a next-generation communication network, the Internet, or a computer network (e.g., an LAN or a wide area network (WAN)). These various types of communication modules may be implemented as a single component (e.g., a single chip), or may be implemented as multiple components (e.g., multiple chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network after a 4th generation (4G) network, and a next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., a mmWave band) to achieve, e.g., a high data transmission rate. The wireless communication module 192 may support various technologies for securing performance on a high-frequency band, such as, e.g., beamforming, massive multiple-input and multiple-output (MIMO), full dimensional MIMO (FD-MIMO), an array antenna, analog beamforming, or a large-scale antenna. The wireless communication module 192 may support various requirements specified in the electronic device 101, an external electronic device (e.g., the electronic device 104), or a network system (e.g., the second network 199). The wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., an external electronic device) of the electronic device 101. The antenna module 197 may include an antenna including a radiating element including a conductive material or a conductive pattern formed in or on a substrate (e.g., a printed circuit board (PCB)). The antenna module 197 may include a plurality of antennas (e.g., an antenna array). In such a case, at least one antenna appropriate for a communication scheme used in a communication network, such as the first network 198 or the second network 199, may be selected by, for example, the communication module 190 from the plurality of antennas. The signal or power may be transmitted or received between the communication module 190 and the external electronic device via the at least one selected antenna. According to an embodiment, another component (e.g., a radio frequency integrated circuit (RFIC)) other than the radiating element may be additionally formed as a part of the antenna module 197.

The antenna module 197 may form a millimeter wave (mmWave) antenna module. The mmWave antenna module may include a PCB, an RFIC on a first surface (e.g., a bottom surface) of the PCB or adjacent to the first surface of the PCB and capable of supporting a designated high-frequency band (e.g., a mmWave band), and a plurality of antennas (e.g., an antenna array) disposed on a second surface (e.g., a top or a side surface) of the PCB, or adjacent to the second surface of the PCB and capable of transmitting or receiving signals in the designated high-frequency band.

At least some of the above-described components may be coupled mutually and exchange signals (e.g., commands or data) therebetween via an inter-peripheral communication scheme (e.g., a bus, general-purpose input and output (GPIO), serial peripheral interface (SPI), or mobile industry processor interface (MIPI)).

According to an embodiment, commands or data may be transmitted or received between the electronic device 101 and the external electronic device (e.g., the electronic device 104) via the server 108 coupled with the second network 199. Each of the external electronic devices (e.g., the electronic device 102 or 104) may be a device of the same type as or a different type from the electronic device 101. All or some of operations to be executed by the electronic device 101 may be executed by one or more of the external electronic devices (e.g., the electronic devices 102 and 104 and the server 108). For example, if the electronic device 101 needs to perform a function or a service automatically, or in response to a request from a user or another device, the electronic device 101, instead of, or in addition to, executing the function or service, may request one or more external electronic devices to perform at least a part of the function or service. The one or more external electronic devices receiving the request may perform the at least part of the function or the service requested, or an additional function or an additional service related to the request and may transfer a result of the performance to the electronic device 101. The electronic device 101 may provide the result, with or without further processing of the result, as at least part of a response to the request. To that end, cloud computing, distributed computing, mobile edge computing (MEC), or client-server computing technology may be used, for example. The electronic device 101 may provide ultra-low latency services using, e.g., distributed computing or MEC. In an embodiment, the external electronic device (e.g., the electronic device 104) may include an Internet-of-things (IoT) device. The server 108 may be an intelligent server using machine learning and/or a neural network. The external electronic device (e.g., the electronic device 104) or the server 108 may be included in the second network 199. The electronic device 101 may be applied to intelligent services (e.g., a smart home, a smart city, a smart car, or healthcare) based on 5G communication technology or IoT-related technology.

According to an embodiment, an electronic device may be a device of one of various types. The electronic device may include, as non-limiting examples, a portable communication device (e.g., a smartphone, etc.), a computing device, a portable multimedia device, a portable medical device, a camera, a wearable device, or a home appliance. However, the electronic device is not limited to the foregoing examples.

It is to be understood that various embodiments of the disclosure and the terms used therein are not intended to limit the technological features set forth herein to particular embodiments and include various changes, equivalents, or replacements for a corresponding embodiment. In connection with the description of the drawings, like reference numerals may be used for similar or related components. It is to be understood that a singular form of a noun corresponding to an item may include one or more of the things unless the relevant context clearly indicates otherwise. As used herein, "A or B," "at least one of A and B," "at least one of A or B," "A, B, or C," "at least one of A, B, and C," and "at least one of A, B, or C," each of which may include any one of the items listed together in the corresponding one of the phrases, or all possible combinations thereof. Terms such as "first," "second," or "first" or "second" may simply be used to distinguish the component from other components in question, and do not limit the components in other aspects (e.g., importance or order). It is to be understood that if an element (e.g., a first element) is referred to, with or without the term "operatively" or "communicatively," as "coupled with," "coupled to," "connected with," or "connected to" another element (e.g., a second element), it denotes that the element may be coupled with the other element directly (e.g., by wire), wirelessly, or via a third element.

As used in connection with certain embodiments of the disclosure, the term "module" may include a unit implemented in hardware, software, or firmware, and may interchangeably be used with other terms, for example, "logic," "logic block," "part," or "circuitry." A module may be a single integral component, or a minimum unit or part thereof, adapted to perform one or more functions. For example, according to an embodiment, the module may be implemented in the form of an application-specific integrated circuit (ASIC).

Various embodiments as set forth herein may be implemented as software (e.g., the program 140) including one or more instructions that are stored in a storage medium (e.g., the internal memory 136 or the external memory 138) that is readable by a machine (e.g., the electronic device 101). For example, a processor (e.g., the processor 120) of the machine (e.g., the electronic device 101) may invoke at least one of the one or more instructions stored in the storage medium and execute it. This allows the machine to be operated to perform at least one function according to the at least one instruction invoked. The one or more instructions may include code generated by a compiler or code executable by an interpreter. The machine-readable storage medium may be provided in the form of a non-transitory storage medium. Here, the term "non-transitory" simply denotes that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method described herein may be included and provided in a computer program product. The computer program product may be traded as a product between a seller and a buyer. The computer program product may be distributed in the form of a machine-readable storage medium (e.g., a compact disc read-only memory (CD-ROM)), or be distributed (e.g., downloaded or uploaded) online via an application store (e.g., PlayStore™), or between two user devices (e.g., smartphones) directly. If distributed online, at least part of the computer program product may be temporarily generated or at least temporarily stored in the machine-readable storage medium, such as a memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2A:
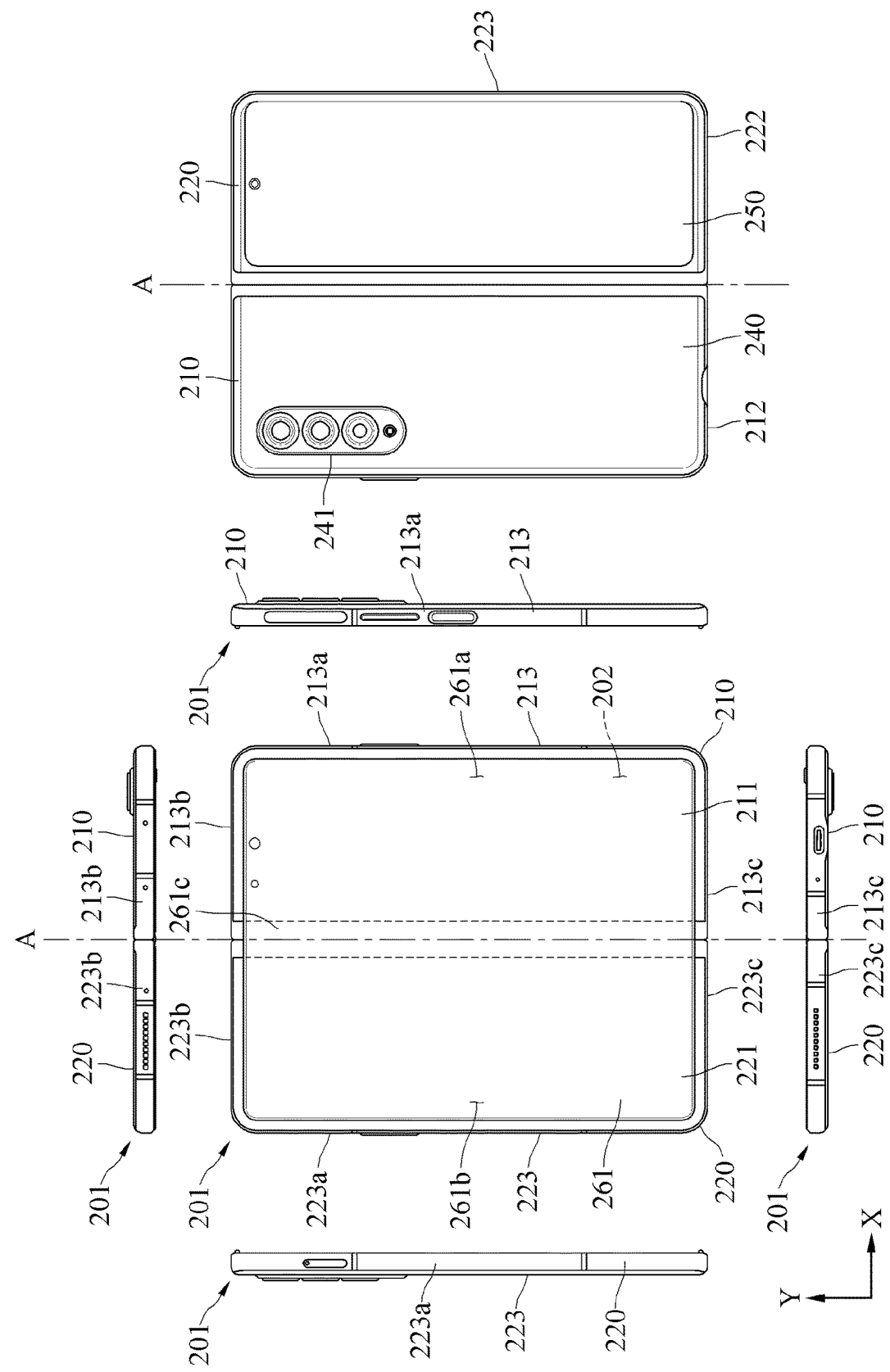
FIG. 2A is a view of an electronic device in an unfolded state according to an embodiment of the disclosure.
Figure 2B:
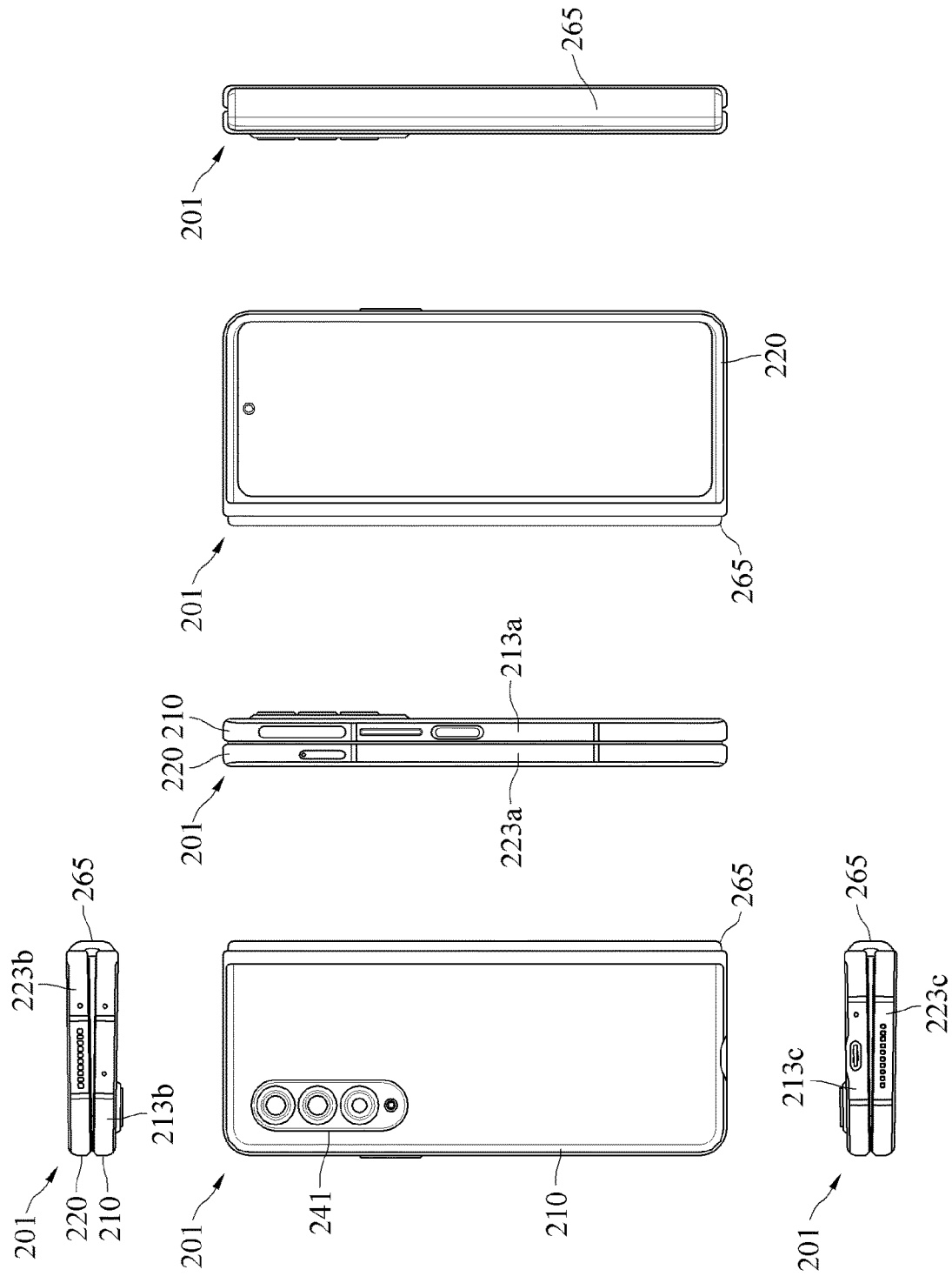
FIG. 2B is a view of an electronic device in a folded state according to an embodiment of the disclosure.
Figure 2C:
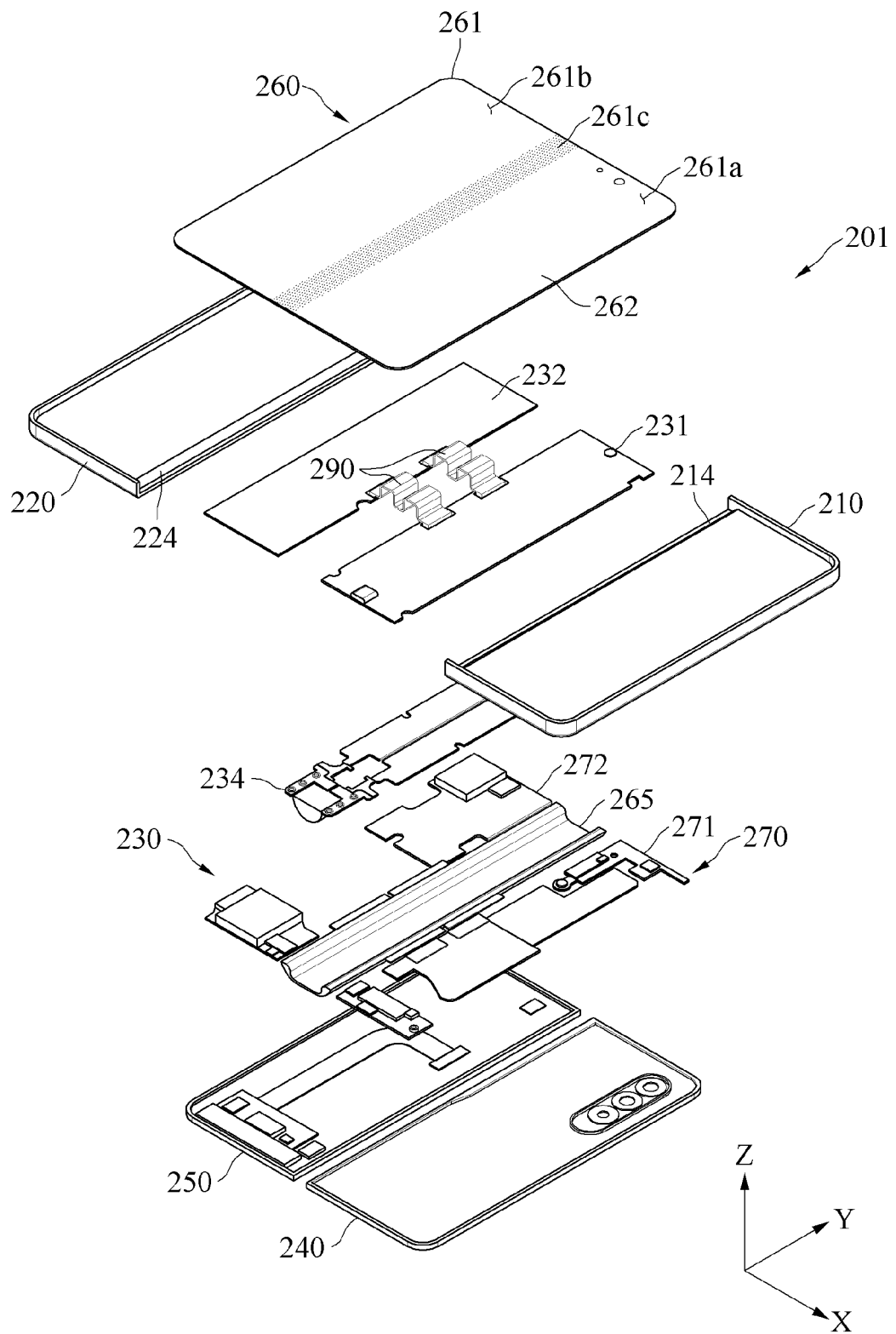
FIG. 2C is an exploded perspective view of an electronic device according to an embodiment of the disclosure.

FIG. 2A is a view of an electronic device in an unfolded state according to an embodiment of the disclosure, FIG. 2B is a view of an electronic device in a folded state according to an embodiment of the disclosure, and FIG. 2C is an exploded perspective view of an electronic device according to an embodiment of the disclosure.

Referring to FIGS. 2A, 2B, and 2C, an electronic device 201 may include a pair of housings 210 and 220 rotatably coupled to each other through a hinge structure (e.g., a hinge structure 334 of FIGS. 3A to 3C) to be folded with respect to each other, a hinge cover 265 covering foldable portions of the housings 210 and 220, and a display 261 (e.g., a flexible display or a foldable display) disposed in a space formed by the housings 210 and 220. According to an embodiment, a surface on which the display 261 is disposed may be defined as a front surface of the electronic device 201, and a surface opposite to the front surface may be defined as a rear surface of the electronic device 201. In addition, a surface surrounding a space between the front surface and the rear surface may be defined as a side surface of the electronic device 201.

In an embodiment, the pair of housings 210 and 220 may include a first housing 210, a second housing 220, a first rear cover 240, and a second rear cover 250. The pair of housings 210 and 220 of the electronic device 201 is not limited to the shape or the combination and/or coupling of components shown in FIGS. 2A and 2B but may be implemented in other shapes or by another combination and/or coupling of components.

In an embodiment, the first housing 210 and the second housing 220 may be disposed on both sides with respect to a folding axis A and may be disposed substantially symmetrically with respect to the folding axis A. In an embodiment, an angle or distance between the first housing 210 and the second housing 220 may vary depending on whether the electronic device 201 is in an unfolded state, a folded state, or an intermediate state. In an embodiment, the first housing 210 and the second housing 220 may have a substantially symmetrical shape.

Figure 3A:
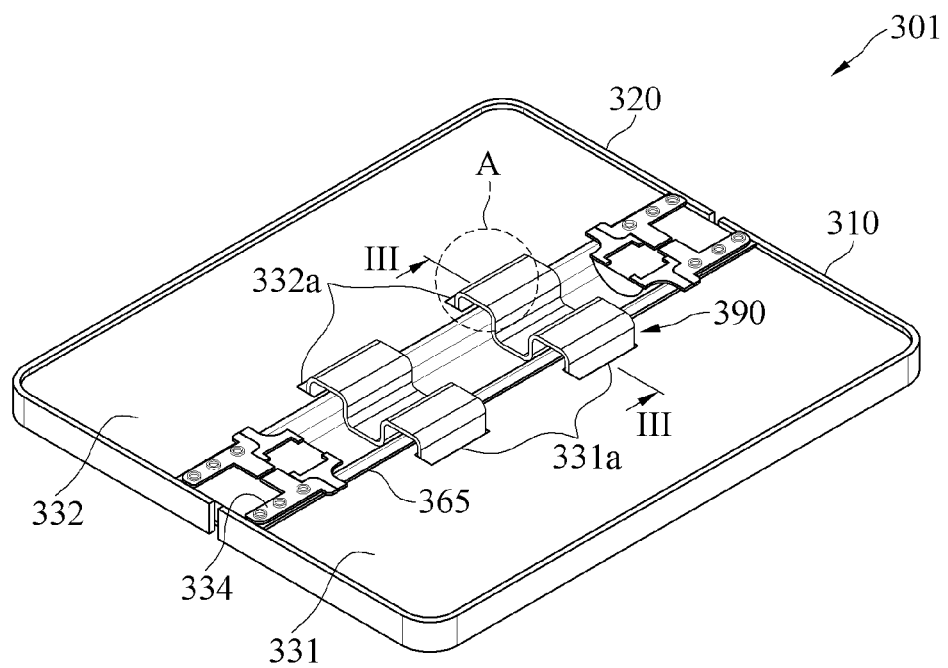
FIG. 3A is a perspective view of an arrangement of a flexible printed circuit board (FPCB) in an electronic device in an unfolded state with a display omitted according to an embodiment of the disclosure.
Figure 3B:
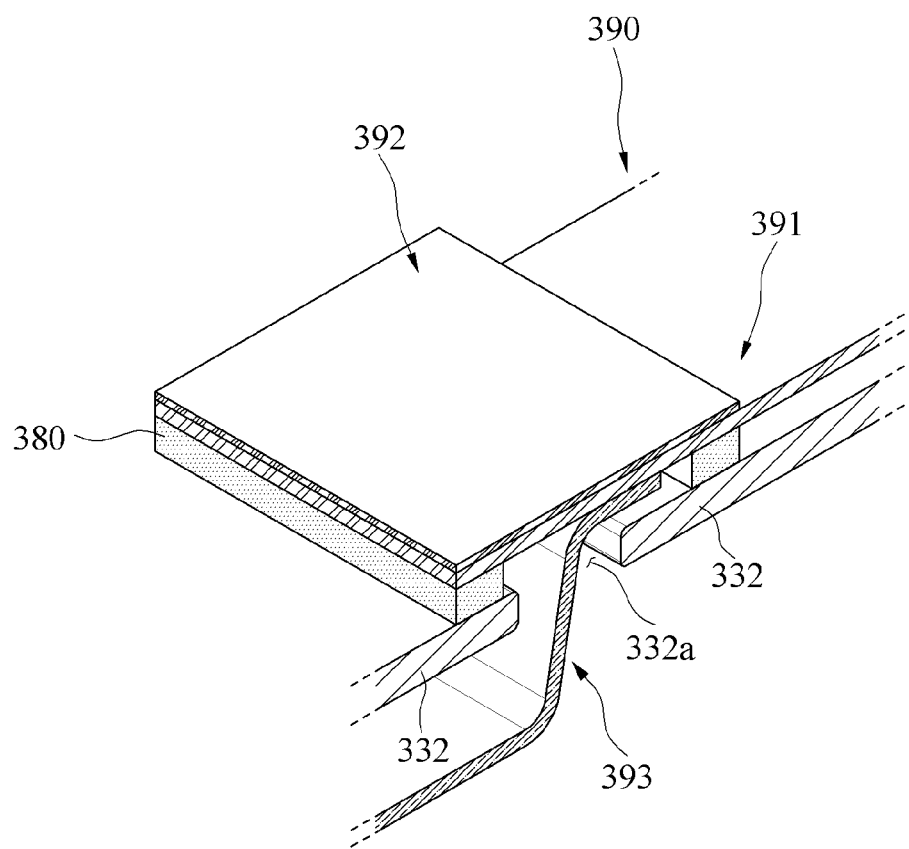
FIG. 3B is an enlarged perspective view of an area A of FIG. 3A according to an embodiment of the disclosure.
Figure 3C:
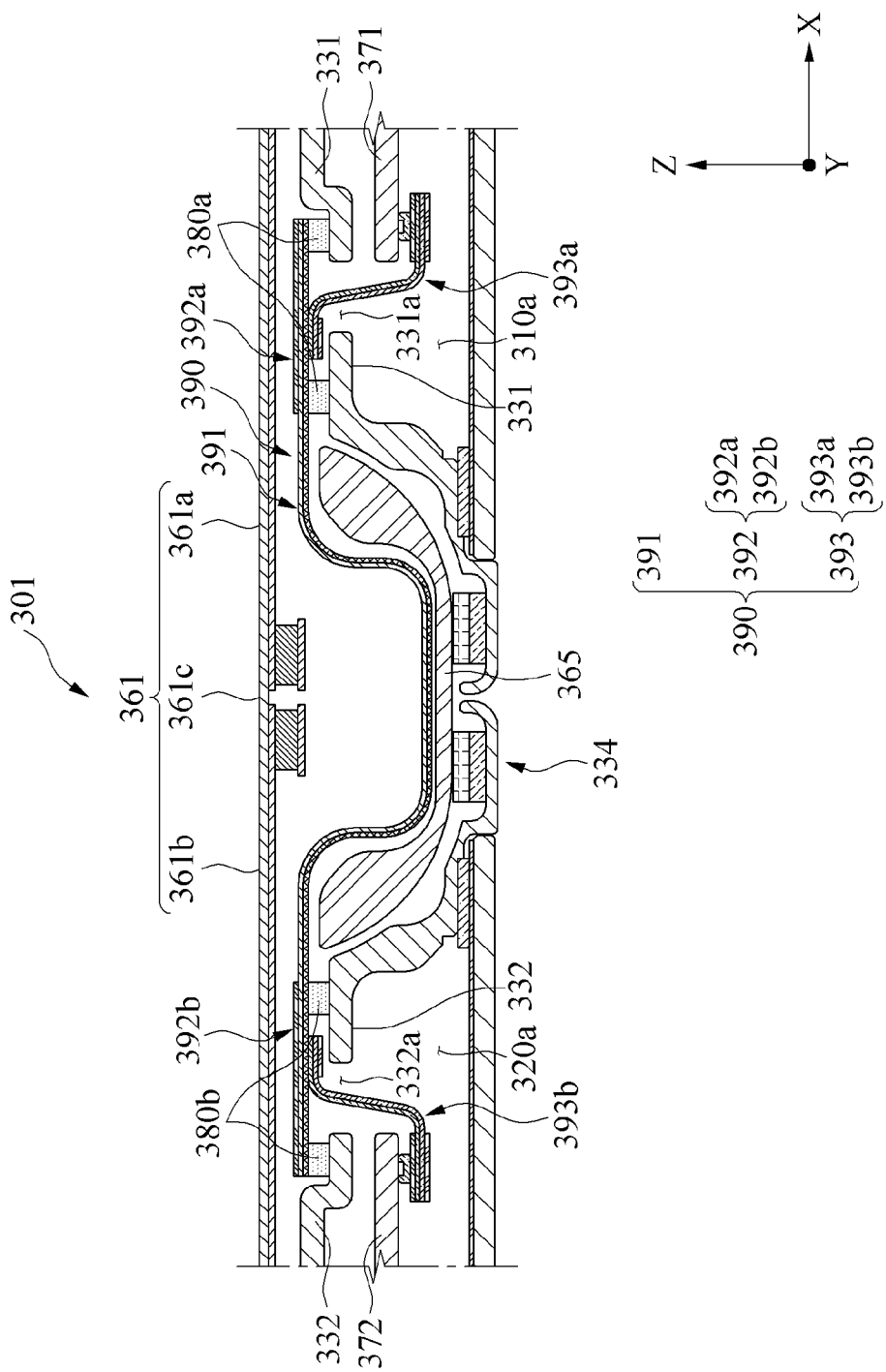
FIG. 3C is a cross-sectional view of the electronic device taken along a line III-III of FIG. 3A according to an embodiment of the disclosure.

In an embodiment, the first housing 210 may be connected to the hinge structure (e.g., the hinge structure 334 of FIGS. 3A to 3C). The first housing 210 may include a first surface 211 facing the front surface of the electronic device 201, a second surface 212 facing a direction opposite to the first surface 211, and a first side portion 213 enclosing at least a portion of a space between the first surface 211 and the second surface 212. The first side portion 213 may include a first side surface 213a disposed substantially in parallel to the folding axis A, a second side surface 213b extending in a direction substantially perpendicular to the folding axis A from one end of the first side surface 213a, and a third side surface 213c extending in a direction substantially perpendicular to the folding axis A from another end of the first side surface 213a and substantially parallel to the second side surface 213b. The second housing 220 may be connected to the hinge structure (e.g., the hinge structure 334 of FIGS. 3A to 3C). The second housing 220 may include a third surface 221 facing the front surface of the electronic device 201, a fourth surface 222 facing a direction opposite to the third surface 221, and a second side portion 223 enclosing at least a portion of a space between the third surface 221 and the fourth surface 222. The second side portion 223 may include a fourth side surface 223a disposed substantially in parallel to the folding axis A, a fifth side surface 223b extending in a direction substantially perpendicular to the folding axis A from one end of the fourth side surface 223a, and a sixth side surface 223c extending in a direction substantially perpendicular to the folding axis A from another end of the fourth side surface 223a and substantially parallel to the fifth side surface 223b. The first surface 211 and the third surface 221 may face each other when the electronic device 201 is in a folded state.

In an embodiment, the electronic device 201 may include at least one sound output module (e.g., the sound output module 155 of FIG. 1) disposed on the fifth side surface 223b and/or the sixth side surface 223c of the second housing 220.

In an embodiment, the electronic device 201 may include a recessed accommodating portion 202 that receives therein the display 261 through a structural coupling of the first housing 210 and the second housing 220. The accommodating portion 202 may have substantially the same size as the display 261.

In an embodiment, at least a portion of the first housing 210 and the second housing 220 may be formed of a metal material or a non-metal material having a predetermined magnitude of rigidity appropriate to support the display 261.

In an embodiment, the electronic device 201 may include at least one component disposed to be visually exposed on the front surface of the electronic device 201 to perform various functions. The component may include, for example, at least one of a front camera module, a receiver, a proximity sensor, an illuminance sensor, an iris recognition sensor, an ultrasonic sensor, or an indicator. In an embodiment, the component included in the electronic device 201 may be disposed not to be visually exposed to the outside of the electronic device 201. For example, the component may be disposed on a rear surface of the display 261. In an embodiment, the first rear cover 240 may be disposed on the second surface 212 of the first housing 210 and may have a substantially rectangular periphery. At least a portion of the periphery of the first rear cover 240 may be surrounded by the first housing 210. The second rear cover 250 may be disposed on the fourth surface 222 of the second housing 220 and may have a substantially rectangular periphery. At least a portion of the periphery of the second rear cover 250 may be surrounded by the second housing 220.

In an embodiment, the first rear cover 240 and the second rear cover 250 may have substantially symmetrical shapes with respect to the folding axis A. In another embodiment, the first rear cover 240 and the second rear cover 250 may have different shapes. In another embodiment, the first housing 210 and the first rear cover 240 may be integrally formed, and the second housing 220 and the second rear cover 250 may be integrally formed.

In an embodiment, the first housing 210, the second housing 20, the first rear cover 240, and the second rear cover 250 may provide a space in which various components (e.g., a PCB, the antenna module 197 of FIG. 1, the sensor module 176 of FIG. 1, or the battery 189 of FIG. 1) of the electronic device 201 may be arranged through a structure in which the first housing 210, the second housing 220, the first rear cover 240, and the second rear cover 250 are coupled to one another. In an embodiment, at least one component may be visually exposed on the rear surface of the electronic device 201. For example, at least one component may be visually exposed through a first rear area 241 of the first rear cover 240. In this example, the component may include, for example, a proximity sensor, a rear camera module, and/or a flash.

In an embodiment, the display 261 may be disposed in the accommodating portion 202 formed by the pair of housings 210 and 220. For example, the display 261 may be arranged to occupy substantially most of the front surface of the electronic device 201. The front surface of the electronic device 201 may include an area in which the display 261 is disposed, and a partial area (e.g., an edge area) of the first housing 210 and a partial area (e.g., an edge area) of the second housing 220, which are adjacent to the display 261. The rear surface of the electronic device 201 may include the first rear cover 240, a partial area (e.g., an edge area) of the first housing 210 adjacent to the first rear cover 240, the second rear cover 250, and a partial area (e.g., an edge area) of the second housing 220 adjacent to the second rear cover 250. In an embodiment, the display 261 may be a display in which at least an area is deformable into a planar surface or a curved surface. In an embodiment, the display 261 may include a flexible area 261c, a first area 261a on a first side (e.g., a right side) of the flexible area 261c, and a second area 261b on a second side (e.g., a left side) of the flexible area 261c. For example, the first area 261a may be disposed on the first surface 211 of the first housing 210, and the second area 261b may be disposed on the third surface 221 of the second housing 220. However, such an area division of the display 261 is provided merely as an example, and the display 261 may be divided into a plurality of areas depending on a structure or function of the display 261. For example, referring to FIG. 2A, the display 261 may be divided into a plurality of areas based on the flexible area 261c extending in parallel to a Y-axis or the folding axis A, or the display 261 may be divided into a plurality of areas based on another folding area (e.g., a folding area extending in parallel to an X-axis) or another folding axis (e.g., a folding axis parallel to the X-axis). This area division of the display 261 described above is provided merely as an example of a physical division based on the pair of housings 210 and 220 and the hinge structure (e.g., the hinge structure 334 of FIGS. 3A to 3C), and the display 261 may display substantially one screen through the pair of housings 210 and 220 and the hinge structure (e.g., the hinge structure 334 of FIGS. 3A to 3C). In an embodiment, the first area 261a and the second area 261b may have substantially symmetrical shapes with respect to the flexible area 261c.

In an embodiment, the hinge cover 265 may be disposed between the first housing 210 and the second housing 220 and configured to cover the hinge structure (e.g., the hinge structure 334 of FIGS. 3A to 3C). The hinge cover 265 may be hidden by at least a portion of the first housing 210 and the second housing 220 or exposed to the outside according to the operating state of the electronic device 201. For example, when the electronic device 201 is in the unfolded state referring to FIG. 2A, the hinge cover 265 may be hidden by the first housing 210 and the second housing 220 without being exposed to the outside, and when the electronic device 201 is in the folded state referring to FIG. 2B, the hinge cover 265 may be exposed to the outside between the first housing 210 and the second housing 220. In addition, when the electronic device 201 is in an intermediate state in which the first housing 210 and the second housing 220 form an angle with each other, at least a portion of the hinge cover 265 may be exposed to the outside between the first housing 210 and the second housing 220. In this case, an area of the hinge cover 265 exposed to the outside may be smaller than the area of the hinge cover 265 exposed when the electronic device 201 is in the folded state. In an embodiment, the hinge cover 265 may have a curved surface.

The operations of the electronic device 201 will be described below. In an embodiment, when the electronic device 201 is in the unfolded state (e.g., the state of the electronic device 201 shown in FIG. 2A), the first housing 210 and the second housing 220 may form a first angle (e.g., approximately 180 degrees (°)) with each other, and the first area 261a and the second area 261b of the display 261 may be oriented in substantially the same direction. The flexible area 261c of the display 261 may be on substantially the same plane as the first area 261a and the second area 261b. In another embodiment, when the electronic device 201 is in the unfolded state, the first housing 210 may rotate at a second angle (e.g., approximately 360°) relative to the second housing 220, whereby the first housing 210 and the second housing 220 may be reversely folded such that the second surface 212 and the fourth surface 222 may face each other. In addition, when the electronic device 201 is in the folded state (e.g., the state of the electronic device 201 shown in FIG. 2B), the first housing 210 and the second housing 220 may face each other. The first housing 210 and the second housing 220 may form an angle of approximately 0° to 10°, and the first area 261a and the second area 261b of the display 330 may face each other. At least a portion of the flexible area 261c of the display 261 may be deformed into a curved surface. In addition, when the electronic device 201 is in the intermediate state, the first housing 210 and the second housing 220 may form a predetermined angle with each other. In this case, an angle (e.g., a third angle, approximately 90°) formed by the first area 261a and the second area 261b of the display 261 may be greater than an angle formed when the electronic device 201 is in the folded state and less than an angle formed when the electronic device 201 is in the unfolded state. At least a portion of the flexible area 261c of the display 261 may be deformed into a curved surface. In this case, a curvature of the curved surface of the flexible area 261c may be smaller than that when the electronic device 201 is in the folded state.

In an embodiment, the electronic device 201 may be folded about the folding axis A by the hinge structure (e.g., the hinge structure 334 of FIGS. 3A to 3C). For example, it is shown in the drawings that the folding axis A is formed by the hinge structure in a vertical direction (e.g., a Y-axis direction) of the electronic device 201 for the convenience of description, but this is merely an example, and the direction in which the axis A is formed is not limited thereto. For example, the folding axis A may be formed by the hinge structure in a horizontal direction (e.g., an X-axis direction) of the electronic device 201, or a plurality of folding axes may be formed all in the same direction or in different directions such that the electronic device 201 may be folded a plurality of times through the folding axes. The various example embodiments of an electronic device described herein are not limited to a form factor of the electronic device 201 described with reference to FIGS. 2A and 2B, and may also apply to electronic devices with various form factors.

Referring to FIG. 2C, the electronic device 201 may include a display module 260 (e.g., the display module 160 of FIG. 1), a hinge assembly 230, a substrate 270, a first housing 210 (e.g., the first housing 210 of FIGS. 2A and 2B), a second housing 220 (e.g., the second housing 220 of FIGS. 2A and 2B), a first rear cover 240 (e.g., the first rear cover 240 of FIGS. 2A and 2B), and a second rear cover 250 (e.g., the second rear cover 250 of FIGS. 2A and 2B).

The display module 260 may include a display 261 (e.g., the display 261 of FIGS. 2A and 2B) and at least one layer or plate 262 on which the display 261 is seated. In an embodiment, the plate 262 may be disposed between the display 261 and the hinge assembly 230. The display 261 may be disposed on at least a portion of one surface (e.g., a top surface) of the plate 262. The plate 262 may be formed in a shape corresponding to the display 261.

In an embodiment, the display 261 may include a flexible display substrate, a plurality of display elements coupled to the display substrate to form multiple pixels, one or more conductive lines coupled to the display substrate and electrically connected to other display elements, and a thin-film encapsulation layer configured to prevent an inflow of external oxygen and moisture. In an embodiment, the display 261 may include a touch panel or may be integrally formed therewith.

The display substrate may be formed of a flexible material, for example, a plastic material such as polyimide (PI), but the material of the display substrate is not limited thereto and may include various materials having flexible properties. The display elements may be arranged on the display substrate and form multiple pixels. For example, the display elements may be arranged in the form of a matrix on the display substrate to form the pixels of the display 261. In this case, the display elements may include a fluorescent material or an organic fluorescent material that represents colors. For example, the display elements may include organic light emitting diodes (OLEDs). The conductive lines may include one or more gate signal lines or one or more data signal lines. For example, the conductive lines may include a plurality of gate signal lines and a plurality of data signal lines, and the gate signal lines and the data signal lines may be arranged in the form of a matrix. In this case, the display elements may be arranged adjacent to a point where a plurality of lines intersect and may be electrically connected to each line. The thin-film encapsulation layer may cover the display substrate, the display elements, and the conductive lines, thereby preventing an inflow of oxygen and moisture from outside. In an embodiment, the thin-film encapsulation layer may be formed by alternately stacking one or more organic film layers and one or more inorganic film layers.

In an embodiment, the touch panel may be provided in an integral form on the display substrate or attached thereto. For example, the touch panel may be formed by patterning an aluminum metal mesh sensor on the thin-film encapsulation layer.

In an embodiment, the polarizing film may be stacked between the display substrate and the touch panel. The polarizing film may improve visibility of the display 261. The polarizing film may change a phase of light passing through the display 261. For example, the polarizing film may convert linearly polarized light into circularly polarized light or convert circularly polarized light into linearly polarized light, thereby preventing reflection of light incident on the display 261.

The window layer may be formed of a transparent plastic film having high flexibility and high hardness. The window layer may be formed of, for example, a polyimide (PI) or polyethylene terephthalate (PET) film. In an embodiment, the window layer may be formed as a multi-layer including a plurality of plastic films.

In an embodiment, the plate 262 may support the rear surface of the display 261, thereby improving the impact resistance of the display 261. In an embodiment, the plate 262 may be divided into areas to support a rear surface of the first area 261a and a rear surface of the second area 261b of the display 261, respectively. In this case, the respective areas of the plate 262 may be separately attached to the rear surface of the first area 261a and the rear surface of the second area 261b of the display 261 so as not to contact each other along the folding axis A. Such a structure may prevent the plate 262 from interfering with a folding operation of the display 261 performed along the folding axis A.

In an embodiment, the plate 262 may be formed of a conductive material, for example, copper or an alloy material including copper. In this case, the plate 262 may function as a heat transfer path that transfers heat generated in an internal component (e.g., an application processor (AP)) in the electronic device to the display 261 while improving the impact resistance of the display 261.

The hinge assembly 230 may include a first bracket 231, a second bracket 232, a hinge structure 234 disposed between the first bracket 231 and the second bracket 232, a hinge cover 265 that covers the hinge structure 234 when viewed from the outside, and an FPCB 290 that traverses the first bracket 231 and the second bracket 232. In an embodiment, the FPCB 290 may be a flexible printed circuit board (FPCB).

In an embodiment, the hinge assembly 230 may be disposed between the plate 262 and the substrate 270. For example, the first bracket 231 may be disposed between the first area 261a of the display 261 and a first PCB 271. The second bracket 232 may be disposed between the second area 261b of the display 261 and a second PCB 272.

In an embodiment, the FPCB 290 and at least a portion of the hinge structure 234 may be disposed inside the hinge assembly 230. The FPCB 290 may be disposed in a direction (e.g., an X-axis direction) that traverses the first bracket 231 and the second bracket 232. The FPCB 290 may be disposed in a direction (e.g., the X-axis direction) perpendicular to a folding axis (e.g., a Y-axis or the folding axis A of FIG. 2A) of the flexible area 261c of the electronic device 201.

The substrate 270 may include the first PCB 271 disposed on a first bracket's side and the second PCB 272 disposed on a second bracket's side. The first PCB 271 and the second PCB 272 may be disposed inside a space formed by the hinge assembly 230, the first housing 210, the second housing 220, the first rear cover 240, and the second rear cover 250. For example, the first PCB 271 may be disposed inside the first housing 210, and the second PCB 272 may be disposed inside the second housing 220. In this case, the first PCB 271 may be disposed between the first bracket 231 and the second surface 212 of the first housing 210, and the second PCB 272 may be disposed between the second bracket 232 and the fourth surface 222 of the second housing 220. Components for implementing various functions of the electronic device 201 may be disposed on the first PCB 271 and the second PCB 272.

The first housing 210 and the second housing 220 may be assembled to be coupled to both sides of the hinge assembly 230 in a state in which the display module 260 is coupled to the hinge assembly 230. The first housing 210 and the second housing 220 may be respectively connected to both sides of the hinge assembly 230.

In an embodiment, the first housing 210 may include a first rotation support surface 214, and the second housing 220 may include a second rotation support surface 224 corresponding to the first rotation support surface 214. The first rotation support surface 214 and the second rotation support surface 224 may include curved surfaces corresponding to the curved surfaces included in the hinge cover 265.

In an embodiment, when the electronic device 201 is in the unfolded state (e.g., the state of the electronic device 201 referring to FIG. 2A), the first rotation support surface 214 and the second rotation support surface 224 may cover the hinge cover 265 such that the hinge cover 265 may not be exposed through the rear surface of the electronic device 201 or may be minimally exposed. In addition, when the electronic device 201 is in the folded state (e.g., the state of the electronic device 201 shown in FIG. 2B), the first rotation support surface 214 and the second rotation support surface 224 may rotate along the curved surfaces included in the hinge cover 265 such that the hinge cover 265 may be maximally exposed through the rear surface of the electronic device 201.

FIG. 3A is a perspective view of an arrangement of an FPCB in an electronic device in an unfolded state with a display omitted according to an embodiment of the disclosure, FIG. 3B is an enlarged perspective view of an area A of FIG. 3A according to an embodiment of the disclosure, and FIG. 3C is a cross-sectional view of the electronic device taken along a line III-III of FIG. 3A according to an embodiment of the disclosure.

Referring to FIGS. 3A to 3C, an electronic device 301 (e.g., the electronic device 101 of FIG. 1 or the electronic device 201 of FIG. 2A) may include a display 361, a first housing 310, a second housing 320, a hinge structure 334, a first bracket 331, a second bracket 332, a first PCB 371, a second PCB 372, an FPCB 390, and a waterproof member 380 (e.g., first waterproof member 380a and second waterproof member 380b).

In an embodiment, the display 361 may include a first area 361a, a second area 361b, and a folding area 361c connecting the first area 361a and the second area 361b. In an embodiment, the first housing 310 may support the first area 361a and form a first space 310a disposed on a rear surface of the first area 361a. The second housing 320 may support the second area 361b and form a second space 320a disposed on a rear surface of the second area 361b.

In an embodiment, the hinge structure 334 may rotatably connect the first housing 310 and the second housing 320 about a folding axis (e.g., a Y-axis of FIG. 3C). In an embodiment, the hinge structure 334 may include a hinge cover 365 disposed between the first housing 310 and the second housing 320. In an embodiment, the hinge structure 334 may be folded while allowing the first area 361a and the second area 361b of the display 361 to change between a first state (e.g., the unfolded state of FIG. 2A) in which they form substantially the same plane and a second state (e.g., the folded state of FIG. 2B) in which they face each other, through a relative rotating operation of the first housing 310 and the second housing 320.

In an embodiment, the first bracket 331 and the second bracket 332 may be rotatably connected to the hinge structure 334. For example, the first bracket 331 may connect the first housing 310 and the hinge structure 334, and the second bracket 332 may connect the second housing 320 and the hinge structure 334. In this example, at least a portion of the first bracket 331 may be disposed in the first space 310a, and at least a portion of the second bracket 332 may be disposed in the second space 320a.

In an embodiment, the first bracket 331 and the second bracket 332 may have openings passing through respective surfaces thereof. For example, the first bracket 331 may have at least one first opening 331a formed to penetrate therethrough toward the first area 361a, and the second bracket 332 may have at least one second opening 332a formed to penetrate therethrough toward the second area 361b. In this case, both ends of the FPCB 390 may pass through the first opening 331a and the second opening 332a to extend to the first space 310a and the second space 320a, respectively.

In an embodiment, the first PCB 371 may be disposed in the first space 310a, and the second PCB 372 may be disposed in the second space 320a. In this case, the first PCB 371 may be disposed in an opposite direction of the display 361 with the first bracket 331 interposed therebetween, and the second PCB 372 may be disposed in an opposite direction of the display 361 with the second bracket 332 interposed therebetween. For example, the first bracket 331 may be disposed between the first area 361a and the first PCB 371, and the second bracket 332 may be disposed between the second area 361b and the second PCB 372.

In an embodiment, the FPCB 390 may electrically connect a component device (e.g., the first PCB 371) disposed in the first housing 310 and a component device (e.g., the second PCB 372) disposed in the second housing 320. In an embodiment, the FPCB 390 may have a longitudinal direction extending from the first space 310a to the second space 320a across the folding axis in an extending direction. In this case, at least a portion of the FPCB 390 may be disposed between the hinge structure 334 and the display 361, and both ends of the FPCB 390 may pass through the first opening 331a and the second opening 332a to extend to the first space 310a and the second space 320a, respectively. For example, both ends of the FPCB 390 may pass through the first opening 331a and the second opening 332a to extend and may thus be connected to the first PCB 371 disposed in the first space 310a and the second PCB 372 disposed in the second space 320a, respectively.

In an embodiment, the FPCB 390 may be formed in a structure that seals the first opening 331a and the second opening 332a while passing through the first opening 331a and the second opening 332a. In an embodiment, the FPCB 390 may include a central portion 391, a first sealing portion 392a, a second sealing portion 392b, a first extension portion 393a, and a second extension portion 393b.

In an embodiment, at least a portion of the central portion 391 may be disposed between the hinge structure 334 and the display 361. For example, at least a portion of the central portion 391 may be received in an internal space of the hinge cover 365. In this case, the central portion 391 may be formed to be partially bent. In an embodiment, both ends of the central portion 391 may extend in a direction of the first bracket 331 and a direction of the second bracket 332, respectively.

In an embodiment, the first sealing portion 392a may be connected to the central portion 391 and disposed on a surface of the first bracket 331 to cover the first opening 331a. The second sealing portion 392b may be connected to the central portion 391 opposite to the first sealing portion 392a and disposed on a surface of the second bracket 332 to cover the second opening 332a. In an embodiment, the first sealing portion 392a may seal the first opening 331a to prevent water or foreign substances from passing through the first opening 331a, and the second sealing portion 392b may seal the second opening 332a to prevent water or foreign substances from passing through the second opening 332a. For example, when viewing the display 361 in the first state, the first sealing portion 392a may be disposed on the surface of the first bracket 331 facing the first area 361a to overlap the first opening 331a, and the second sealing portion 392b may be disposed on the surface of the second bracket 332 to overlap the second opening 332a, referring to FIG. 3C. In this example, the first sealing portion 392a may be formed to have an area and shape that may entirely cover the first opening 331a, and the second sealing portion 392b may be formed to have an area and shape that may entirely cover the second opening 332a.

In an embodiment, the first extension portion 393a may extend to the first space 310a through the first opening 331a, and the second extension portion 393b may extend to the second space 320a through the second opening 332a. In an embodiment, the first extension portion 393a may be electrically connected to the central portion 391 as at least a portion thereof is connected to the first sealing portion 392a, and the second extension portion 393b may be electrically connected to the central portion 391 as at least a portion thereof is connected to the second sealing portion 392b. In this case, an end of the first extension portion 393a extending into the first space 310a may be connected to the first PCB 371, and an end of the second extension portion 393b extending into the second space 320a may be connected to the second PCB 372, and an electrical signal may thereby be transferred between the first PCB 371 and the second PCB 372.

In an embodiment, the first extension portion 393a may be connected in a direction opposite to the first area 361a with respect to the first sealing portion 392a, and the second extension portion 393b may be connected in a direction opposite to the second area 361b with respect to the second sealing portion 392b. In an embodiment, when viewing the display 361 in the first state (e.g., a state viewed in a −Z-axis direction of FIG. 3C), the first extension portion 393a may be connected to a portion of the first sealing portion 392a overlapping the first opening 33a, and the second extension portion 393b may be connected to a portion of the second sealing portion 392b overlapping the second opening 332a. In this case, the first sealing portion 392a may be connected to the first bracket 331 along a circumference of the first opening 331a without interfering with the first extension portion 393a, and the second sealing portion 392b may be connected to the second bracket 332 along a circumference of the second opening 332a without interfering with the second extension portion 393b.

In an embodiment, the FPCB 390 may be provided in a form in which the first sealing portion 392a and the second sealing portion 392b are expanded to seal the first opening 331a and the second opening 332a. In an embodiment, based on a width perpendicular to the extension direction, the first extension portion 393a and the second extension portion 393b may be formed to have a width corresponding to the first opening 331a and the second opening 332a such that they pass through the first opening 331a and the second opening 332a. In this case, the central portion 391 may be formed to have a width corresponding to extension portion 393 for transmission of electric signals with the extension portion 393. In an embodiment, a sealing portion 392 may include a connecting area extending to an area around the openings 331a and 332a to cover the openings 331a and 332a, and may thus have a width greater than that of the central portion 391 and the sealing portion 392 based on the width perpendicular to the extension direction. In this case, the sealing portion 392 may be connected to the surfaces (e.g., the surfaces facing the +Z axis) of the brackets 331 and 332 through the connecting area and may thereby seal the first opening 331a and the second opening 332a.

In an embodiment, the first waterproof member 380a may seal between the first bracket 331 and the first sealing portion 392a so as to surround the circumference of the first opening 331a, and the second waterproof member 380b may seal between the second bracket 332 and the second sealing portion 392b so as to surround the circumference of the second opening 332a. For example, the first waterproof member 380a may be formed in a closed-loop shape that surrounds the first opening 331a to connect the first bracket 331 and the first sealing portion 392a to each other. Similarly, the second waterproof member 380b may be formed in a closed-loop shape that surrounds the second opening 332a to connect the second bracket 332 and the second sealing portion 392b to each other. In this case, the first waterproof member 380a and the second waterproof member 380b may be connected to respective extended connecting areas of the first sealing portion 392a and the second sealing portion 392b.

In an embodiment, the FPCB 390 may seal the first opening 331a and the second opening 332a through the first sealing portion 392a and the second sealing portion 392b, while simultaneously extending to the first space 310a and the second space 320a through the first extension portion 393a and the second extension portion 393b electrically connected to the central portion 391, thereby securing the waterproof performance for the first space 310a and the second space 320a without a separate sealing structure for sealing the openings 331a and 332a.

Figure 4A:
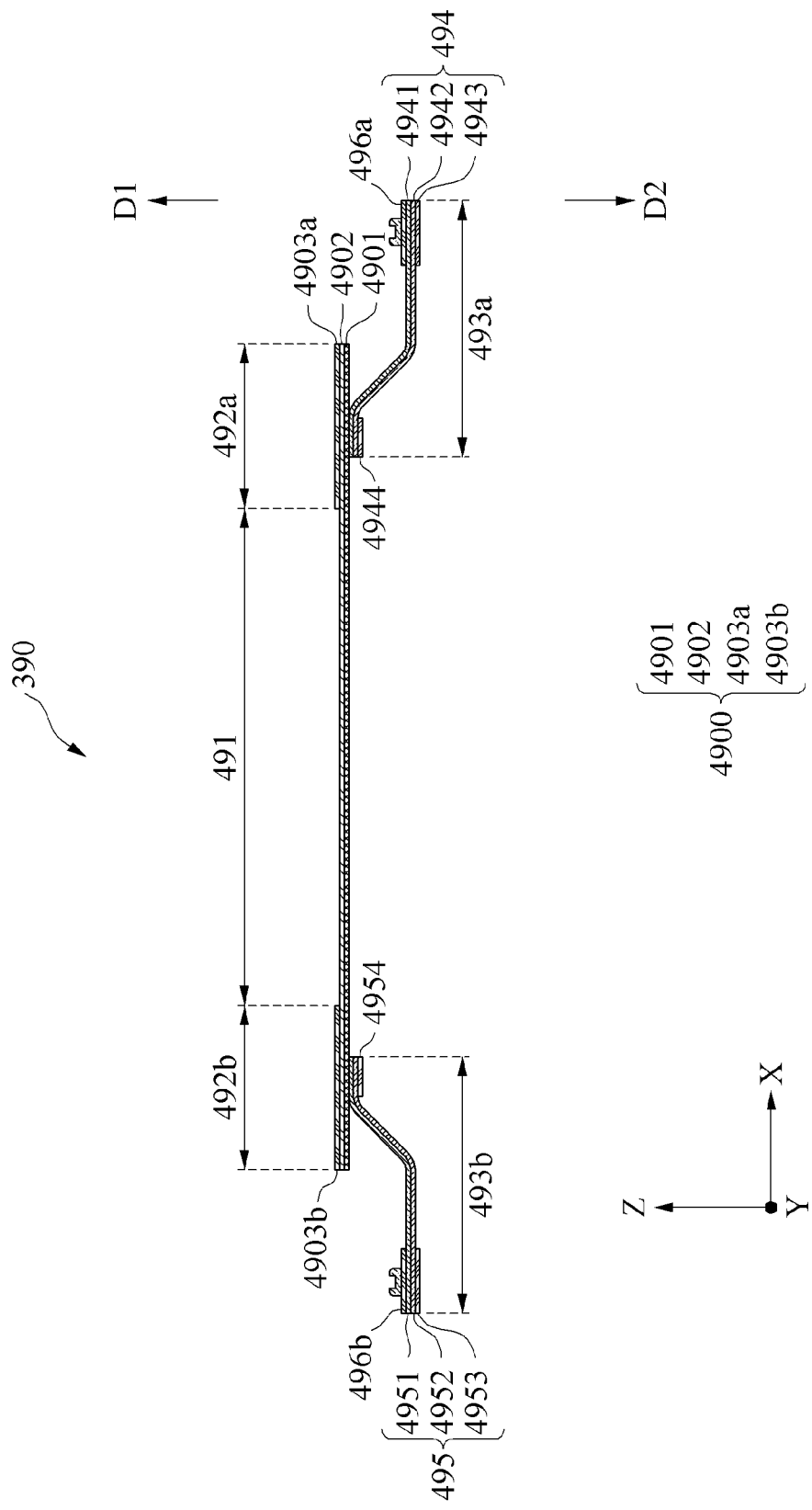
FIG. 4A is a cross-sectional view of an FPCB according to an embodiment of the disclosure.
Figure 4B:
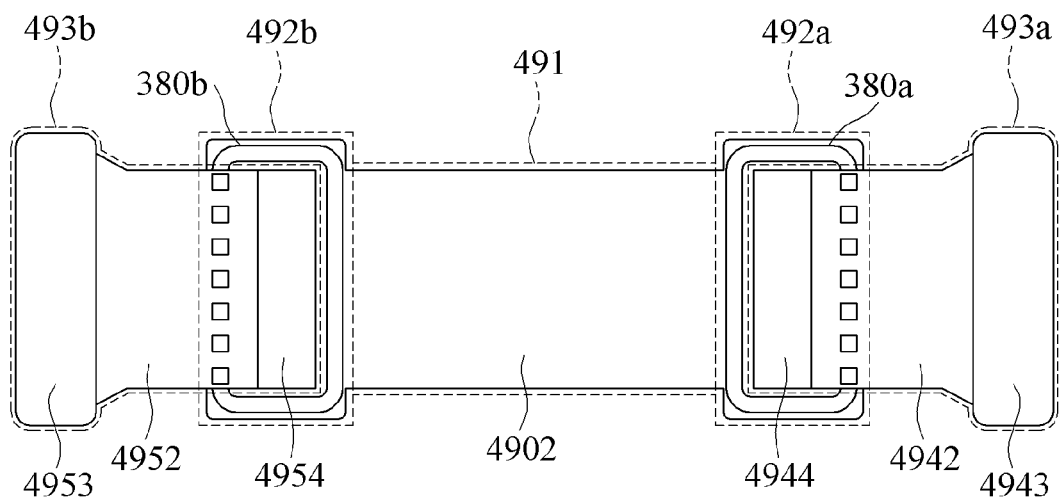
FIG. 4B is a plan view of an FPCB according to an embodiment of the disclosure.
Figure 4C:
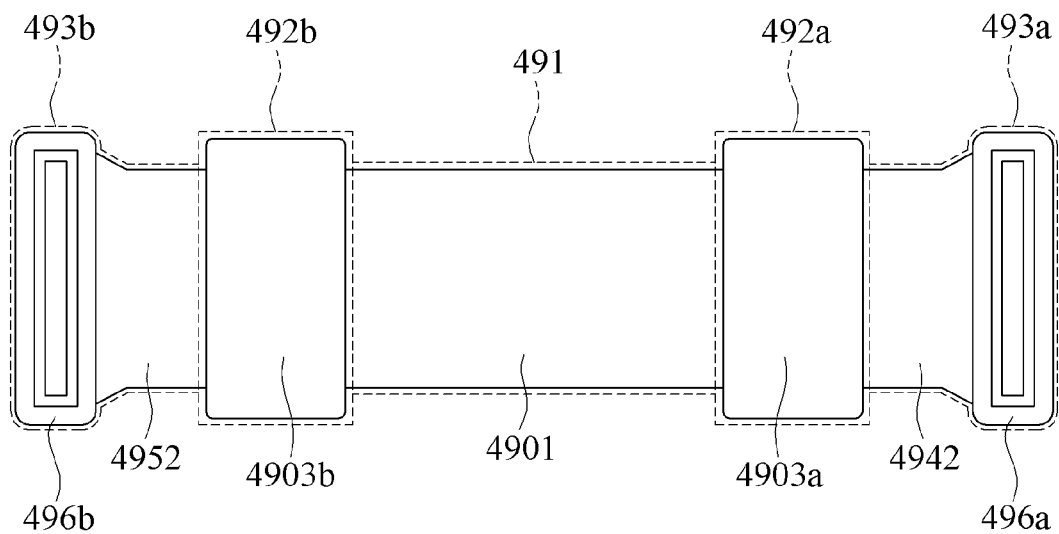
FIG. 4C is a rear view of an FPCB according to an embodiment of the disclosure.

FIG. 4A is a cross-sectional view of an FPCB according to an embodiment of the disclosure, FIG. 4B is a plan view of an FPCB according to an embodiment of the disclosure, and FIG. 4C is a rear view of an FPCB according to an embodiment of the disclosure.

FIGS. 4A to 4C show example configurations of the FPCB 390 shown in FIG. 3C. Referring to FIGS. 4A to 4C, an FPCB 390 may include a base member 4900, a first connection member 494 connected to the base member 4900, and a second connection member 495 connected to the base member 4900 to be opposite to the first connection member 494 with respect to an extension direction (e.g., an X-axis direction in FIG. 4A).

In an embodiment, the base member 4900 may form a central portion 491, a first sealing portion 492a, and a second sealing portion 492b. In an embodiment, the base member 4900 may have a multi-layer structure in which a plurality of layers is stacked. In an embodiment, the base member 4900 may include a first layer 4901, a second layer 4902, a third layer 4903a, and a fourth layer 4903b.

In an embodiment, the first layer 4901 and the second layer 4902 may extend along the extension direction to form the central portion 491, the first sealing portion 492a, and the second sealing portion 492b. A metal pattern for signal transmission in the extension direction may be formed on the first layer 4901 and the second layer 4902. In an embodiment, based on the first state shown in FIG. 3C, the second layer 4902 may be stacked in a first direction D1 (e.g., the +Z-axis direction of FIG. 3C) toward a display (e.g., the display 361 of FIG. 3C) with respect to the first layer 4901. Hereinafter, for the convenience of description, a direction in which the second layer 4902 is stacked with respect to the first layer 4901 will be referred to as a first direction D1 (e.g., a +Z-axis direction of FIG. 4A), and a direction opposite to the first direction D1 will be referred to as a second direction D2 (e.g., a −Z-axis direction of FIG. 4A).

In an embodiment, the third layer 4903a and the fourth layer 4903b may be stacked on the second layer 4902 in the first direction D1. In this case, the third layer 4903a may be stacked on a portion of the second layer 4902 that forms the first sealing portion 492a, and the fourth layer 4903b may be stacked on a portion of the second layer 4902 that forms the second sealing portion 492b. The third layer 4903a and the fourth layer 4903b may reinforce the first sealing portion 492a and the second sealing portion 492b of the base member 4900, while simultaneously improving the rigidity of the first sealing portion 492a and the second sealing portion 492b to allow the first sealing portion 492a and the second sealing portion 492b to be connected to brackets (e.g., the brackets 331 and 332 of FIG. 3C).

In an embodiment, the first connection member 494 may be connected to the base member 4900 to overlap at least partially, forming a first extension portion 493a. The second connection member 495 may be connected to the base member 4900 to overlap at least partially, forming a second extension portion 493b. For example, the first connection member 494 may be connected to the first sealing portion 492a of the base member 4900, and the second connection member 495 may be connected to the second sealing portion 492b of the base member 4900. In an embodiment, the first connection member 494 and the second connection member 495 may be formed in a multi-layer structure in which a plurality of layers is stacked. In an embodiment, each of the first connection member 494 and the second connection member 495 may include a first connecting layer (e.g., first connecting layers 4941 and 4951, respectively), a second connecting layer (e.g., second connecting layers 4942 and 4952, respectively), a third connecting layer (e.g., third connecting layers 4943 and 4953, respectively), and a fourth connecting layer (e.g., fourth connecting layers 4944 and 4954, respectively).

In an embodiment, the first connecting layer 4941 and the second connecting layer 4942 may extend along the extension direction to form the first extension portion 493a and the second extension portion 493b. A metal pattern for signal transmission in the extension direction may be formed on the first connecting layer 4941 and the second connecting layer 4942. Accordingly, the first connection member 494 and the second connection member 495 may be electrically connected to the base member 4900 to transmit electrical signals to each other. In an embodiment, the first connecting layers 4941 and 4951 may be stacked on the first layer 4901 in the second direction D2, and the second connecting layers 4942 and 4952 may be stacked on the first connecting layers 4941 and 4951 in the second direction D2. In an embodiment, the first connection member 494 may include a first connecting portion formed at an extended end, to which a first connecting terminal 496a is connected. The second connection member 495 may include a second connecting portion formed at an end extending in an opposite direction of the first connection member 494, to which a second connecting terminal 496b is connected. For example, the first connection member 494 may be connected to a first PCB (e.g., the first PCB 371 of FIG. 3C) through the first connecting terminal 496a, and the second connection member 495 may be connected to a second PCB (e.g., the second PCB 372 of FIG. 3C) through the second connecting terminal 496b.

In an embodiment, the third connecting layers 4943 and 4953 may be stacked in the second direction D2 on respective portions of the second connecting layers 4942 and 4952 forming the connecting portions. For example, the first connection member 494 may include the third connecting layer 4943 stacked in the second direction D2 on a portion of the second connecting layer 4942 forming the first connecting portion, and the second connection member 495 may include the third connecting layer 4953 stacked in the second direction D2 on a portion of the second connecting layer 4952 forming the second connecting portion. The third connecting layers 4943 and 4953 may improve the rigidity of the connecting portions of the respective connection members.

In an embodiment, the fourth connecting layers 4944 and 4954 may be stacked in the second direction D2 on the second connecting layers 4942 and 4952 to overlap the base member 4900. For example, the first connection member 494 may include the fourth connecting layer 4944 stacked on a portion of the second connecting layer 4942 connected to overlap the first sealing portion 492a, and the second connection member 495 may include the fourth connecting layer 4954 stacked on a portion of the second connecting layer 4952 connected to overlap the second sealing portion 492b. In an embodiment, the fourth connecting layers 4944 and 4954 may improve the rigidity of the connecting portions of the connection members 494 and 495 with respect to the base member 4900.

In an embodiment, the sealing portions 492a and 492b of the base member 4900 may be provided in an extended form, compared to the central portion 491 referring to FIG. 4B, to cover openings (e.g., the first openings 321a and 322a of FIG. 3C). For example, the first layer 4901 and the second layer 4902 may be formed to have a greater width (e.g., a width in a Y-axis direction in FIG. 4B) in the sealing portions 492a and 492b compared to the central portion 491. In an embodiment, the sealing portions 492a and 492b of the base member 4900 may include connecting areas that extend to circumferences of portions of the connection members 454 and 495 connected to the second layer 4902. In this case, in the connecting areas of the sealing portions 492a and 492b, the waterproof members 380a and 380b forming closed loops may be disposed in the second direction D2. For example, the first waterproof member 380a may be connected to the first layer 4901 forming the first sealing portion 492a in the second direction D2, and the second waterproof member 380b may be connected to the first layer 4901 forming the second sealing portion 492b in the second direction D2.

In an embodiment, the first sealing portion 492a and the second sealing portion 492b of the FPCB 390 may have a greater rigidity than other portions, for example, the central portion 491. For example, referring to FIG. 4A, the first sealing portion 492a and the second sealing portion 492b may have a relatively greater number of layers that are stacked compared to another portion, and may thereby secure a sufficiently great rigidity to be firmly connected to the brackets (e.g., the brackets 331 and 332 of FIG. 3C).

Figure 5A:
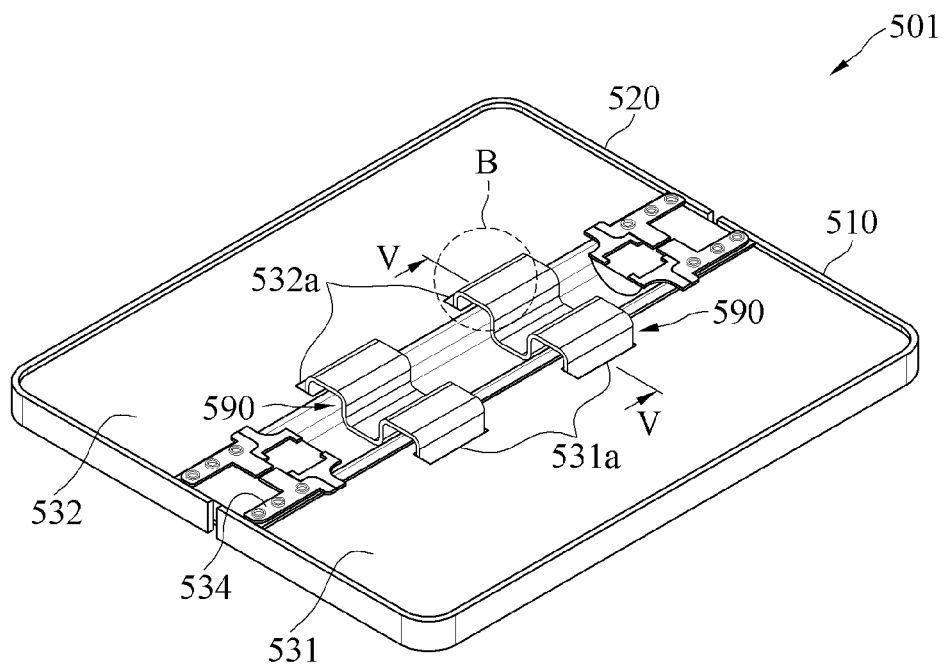
FIG. 5A is a perspective view of an arrangement of an FPCB in an electronic device in an unfolded state according to an embodiment of the disclosure.
Figure 5B:
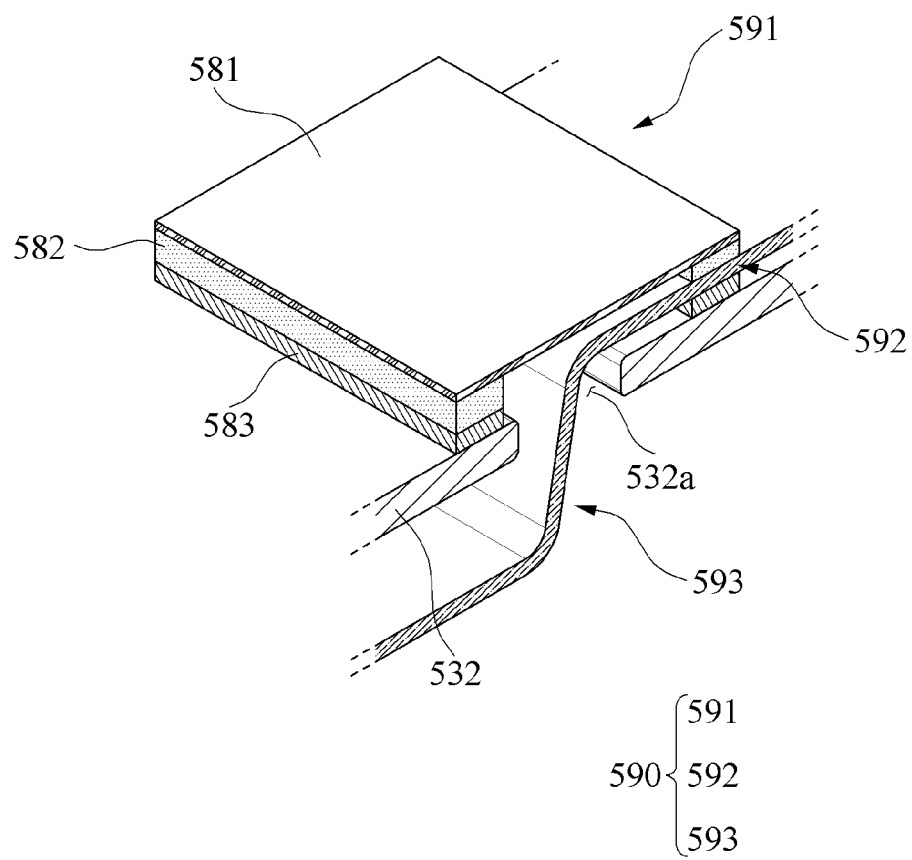
FIG. 5B is an enlarged perspective view of an area B of FIG. 5A according to an embodiment of the disclosure.
Figure 5C:
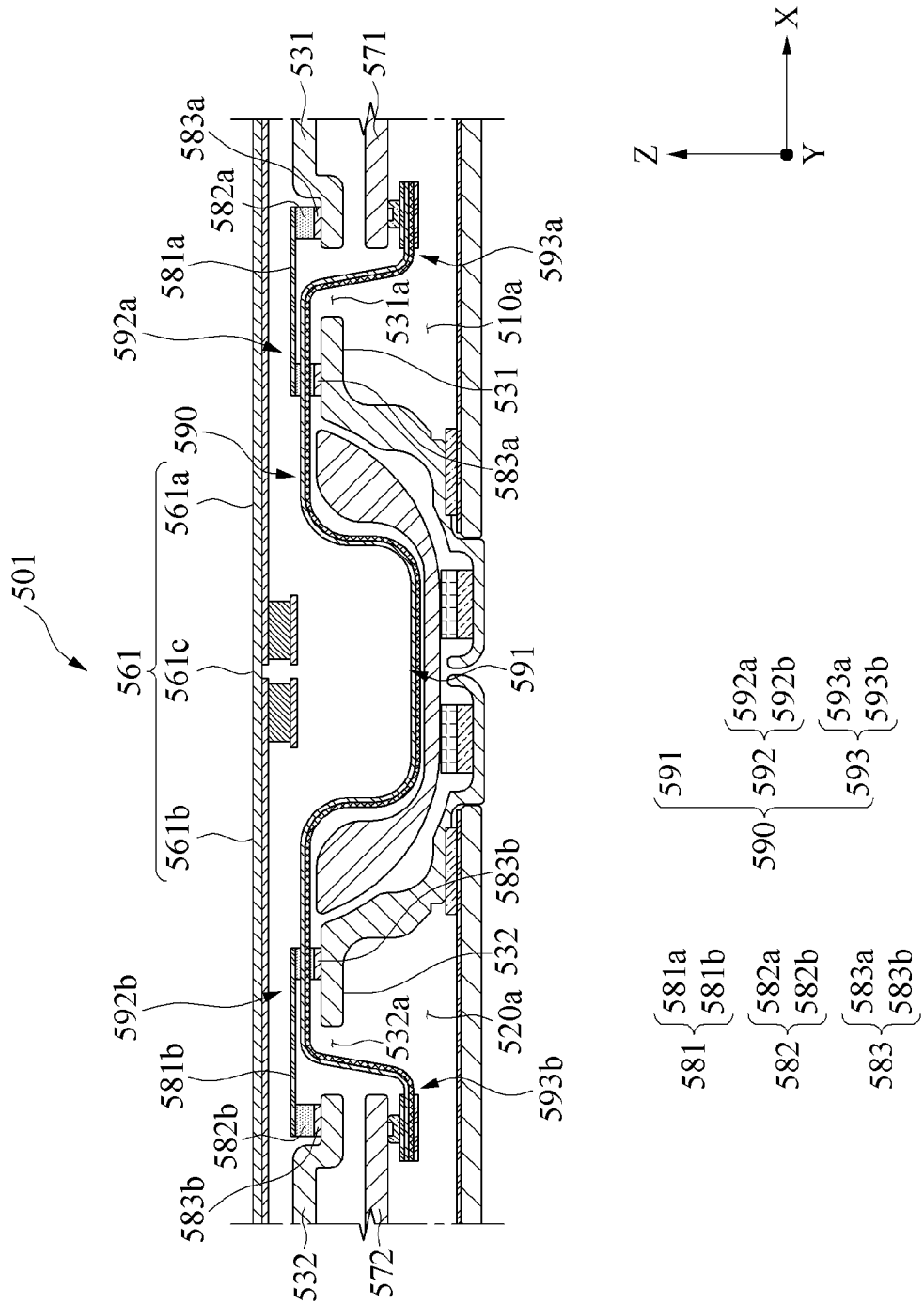
FIG. 5C is a cross-sectional view of the electronic device taken along a line VI-VI of FIG. 5A according to an embodiment of the disclosure.

FIG. 5A is a perspective view of an arrangement of an FPCB in an electronic device in an unfolded state according to an embodiment of the disclosure, FIG. 5B is an enlarged perspective view of an area B of FIG. 5A according to an embodiment of the disclosure, and FIG. 5C is a cross-sectional view of the electronic device taken along a line V-V of FIG. 5A according to an embodiment of the disclosure.

Referring to FIGS. 5A to 5C, an electronic device 501 (e.g., the electronic device 101 of FIG. 1 or the electronic device 201 of FIG. 2A) may include a display 561, a first housing 510, a second housing 520, a hinge structure 534, a first bracket 531, a second bracket 532, a first PCB 571, a second PCB 572, an FPCB 590, a spacer 582 (e.g., first spacer 582a and second spacer 582b), a waterproof member 583 (e.g., first waterproof member 583a, and second waterproof member 583b)

In an embodiment, the display 561 may include a first area 561a, a second area 561b, and a folding area 561c connecting the first area 561a and the second area 561b. In an embodiment, the first housing 510 may support the first area 561a and form a first space 510a disposed on a rear surface of the first area 561a. The second housing 520 may support the second area 561b and form a second space 520a disposed on a rear surface of the second area 561b. In an embodiment, the hinge structure 534 may rotatably connect the first housing 510 and the second housing 520. In an embodiment, the hinge structure 534 may be folded such that the first area 561a and the second area 561b of the display 561 change between a first state (e.g., the unfolded state of FIG. 2A) in which they form substantially the same plane and a second state (e.g., the folded state of FIG. 2B) in which they face each other, through a relative rotating operation of the first housing 510 and the second housing 520.

In an embodiment, the first bracket 531 may connect the first housing 510 and the hinge structure 534, and at least a portion thereof may be disposed in the first space 510a. The second bracket 532 may connect the second housing 520 and the hinge structure 534, and at least a portion thereof may be disposed in the second space 520a. In an embodiment, the first bracket 531 may include a first opening 531a passing through a surface thereof toward the first area 561a, and the second bracket 532 may include a second opening 532a passing through a surface thereof toward the second area 561b. In an embodiment, the first PCB 571 may be disposed in the first space 510a to be opposite to the first area 561a with respect to the first bracket 531, and the second PCB 572 may be disposed in the second space 520a to be opposite to the second area 561b with respect to the second bracket 532.

In an embodiment, the FPCB 590 may extend from the first space 510a to the second space 520a across the hinge structure 534. In this case, both ends of the FPCB 590 extending to the first space 510a and the second space 520a may be connected to the first PCB 571 and the second PCB 572, respectively. In an embodiment, the FPCB 590 may include a central portion 591, a sealing portion 592 (e.g., first sealing portion 592a and second sealing portion 592b), and an extension portion 593 (e.g., first extension portion 593a and second extension portion 593b).

In an embodiment, at least a portion of the central portion 591 may be disposed between the hinge structure 534 and the display 561, and both ends thereof may extend in a direction of the first bracket 531 and a direction of the second bracket 532, respectively. The central portion 591 may be formed to be partially bent. In an embodiment, the first sealing portion 592a may be connected to the central portion 591 and may be disposed on a surface of the first bracket 531 adjacent to the first opening 531a, for example, a surface of the first bracket 531 toward a +Z axis in FIG. 5A. The second sealing portion 592b may be connected to the central portion 591 to be opposite to the first sealing portion 592a and may be disposed on a surface of the second bracket 532 adjacent to the second opening 532a, for example, a surface of the second bracket 532 toward the +Z-axis in FIG. 5A). In an embodiment, a position the first sealing portion 592a may be fixed on the surface of the first bracket 531, and a position of the second sealing portion 592b may be fixed on the surface of the second bracket 532. In an embodiment, the first extension portion 593a may be connected to the first sealing portion 592a to be opposite to the central portion 591 and may pass through the first opening 531a to extend to the first space 510a. The second extension portion 593b may be connected to the second sealing portion 592b to be opposite to the central portion 591 and may pass through the second opening 532a to extend to the second space 520a. In this case, an end of the first extension portion 593a extending into the first space 510a may be connected to the first PCB 571, and an end of the second extension portion 593b extending into the second space 520a may be connected to the second PCB 572.

In an embodiment, a cover member 581 (e.g., first cover member 581a) may be at least partially connected to the FPCB 590 and disposed on the surface of the first bracket 531 to cover the first opening 531a. For example, the first cover member 581a may be connected to the first sealing portion 592a of the FPCB 590. In an embodiment, a cover member 581 (e.g., a second cover member 581b) may be at least partially connected to the FPCB 590 and disposed on the surface of the second bracket 532 to cover the second opening 532a. For example, the second cover member 581b may be connected to the second sealing portion 592b of the FPCB 590. In an embodiment, when viewing the display 561 in the first state (e.g., viewing in a −Z axis in FIG. 5C), the first cover member 581a may be disposed between the first bracket 531 and the first area 561a to overlap the first opening 531a, and the second cover member 581b may be disposed between the second bracket 532 and the second area 561b to overlap the second opening 532a. In an embodiment, the first cover member 581a may be formed to have an area and shape that entirely covers the first opening 531a, and the second cover member 581b may be formed to have an area and shape that entirely covers the second opening 532a.

In an embodiment, the first spacer 582a may connect the first cover member 581a and the first bracket 531 along a circumference of the first opening 531a, and the second spacer 582b may connect the second cover member 581b and the second bracket 532 along a circumference of the second opening 532a. In an embodiment, when viewing the display 561 in the first state, the first spacer 582a and the first sealing portion 592a may form a closed loop that surrounds the circumference of the first opening 531a, and the second spacer 582b and the second sealing portion 592b may form a closed loop that surrounds the second opening 532a. In this case, a waterproofing material for filling a gap through which water may be introduced may be applied respectively to a space between the first the first spacer 582a and the first sealing portion 592a in contact with each other, and to a space between the second spacer 582b and a second connecting portion in contact with each other.

In an embodiment, based on a thickness in the Z-axis direction of FIG. 5C, the first spacer 582a may have a thickness substantially the same as that of the first sealing portion 592a, i.e., may be formed to have substantially the same thickness as a gap between the first cover member 581a and the first bracket 531. The second spacer 582b may have a thickness substantially the same as that of the second sealing portion 592b, i.e., may be formed to have substantially the same thickness as a gap between the second cover member 581b and the second bracket 532. In this case, the first cover member 581a may be connected substantially in parallel to the surface of the first bracket 531, and the second cover member 581b may be connected substantially in parallel to the surface of the second bracket 532.

In an embodiment, the first waterproof member 583a may seal between the first cover member 581a and the first bracket 531, and the second waterproof member 583b may seal between the second cover member 581b and the second bracket 532. In an embodiment, the first waterproof member 583a may form a closed loop along the circumference of the first opening 531a, and may connect the first spacer 582a and the first sealing portion 592a to the first bracket 531. The second waterproof member 583b may form a closed loop along the circumference of the second opening 532a, and may connect the second spacer 582b and the second sealing portion 592b to the second bracket 532.

Figure 6A:
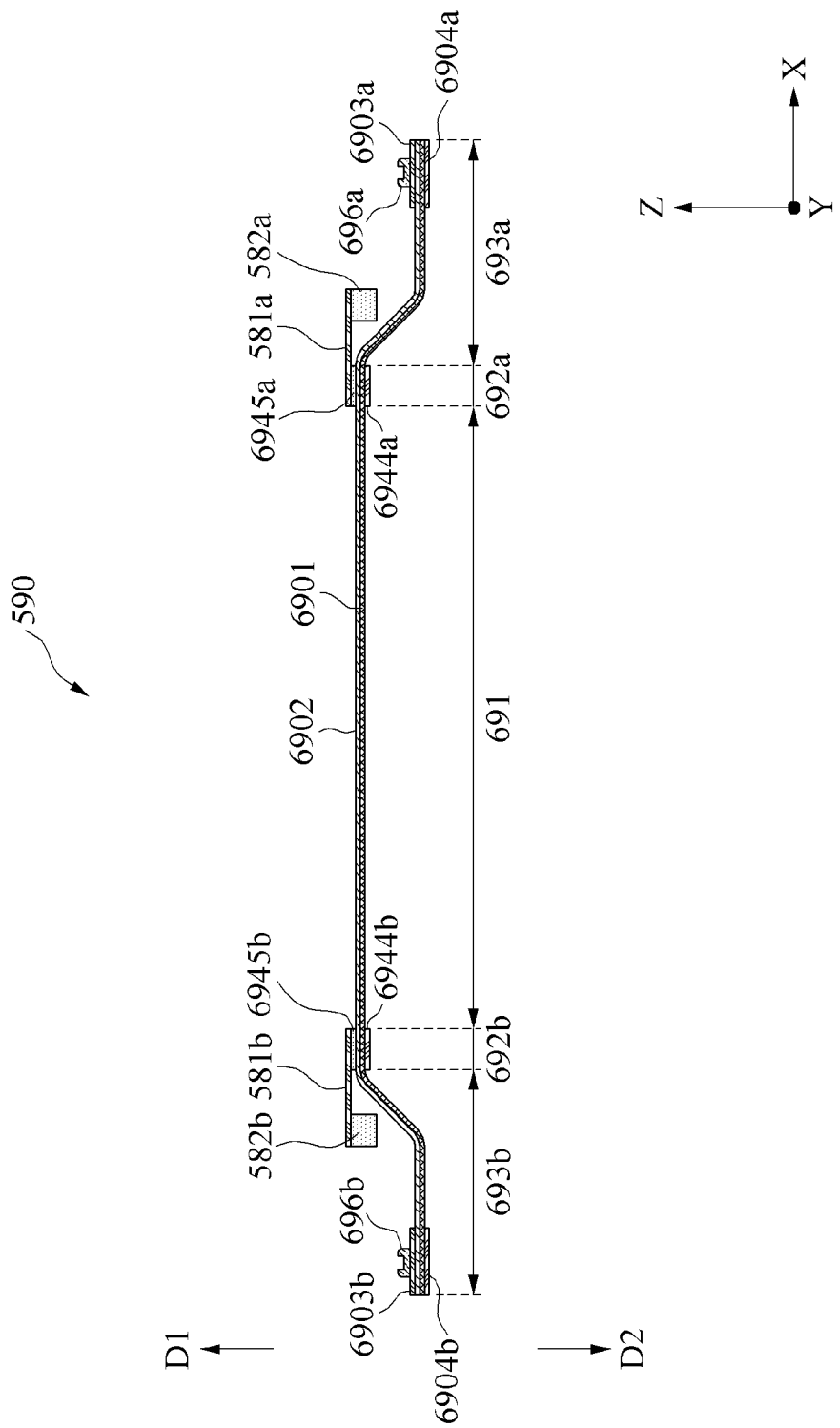
FIG. 6A is a cross-sectional view of an FPCB according to an embodiment of the disclosure.
Figure 6B:
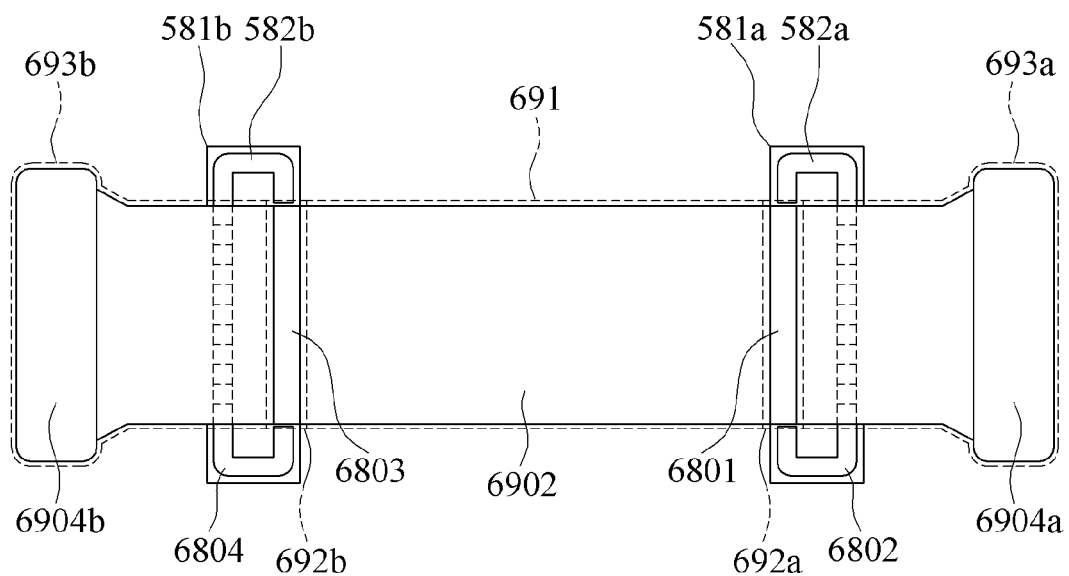
FIG. 6B is a plan view of an FPCB according to an embodiment of the disclosure.
Figure 6C:
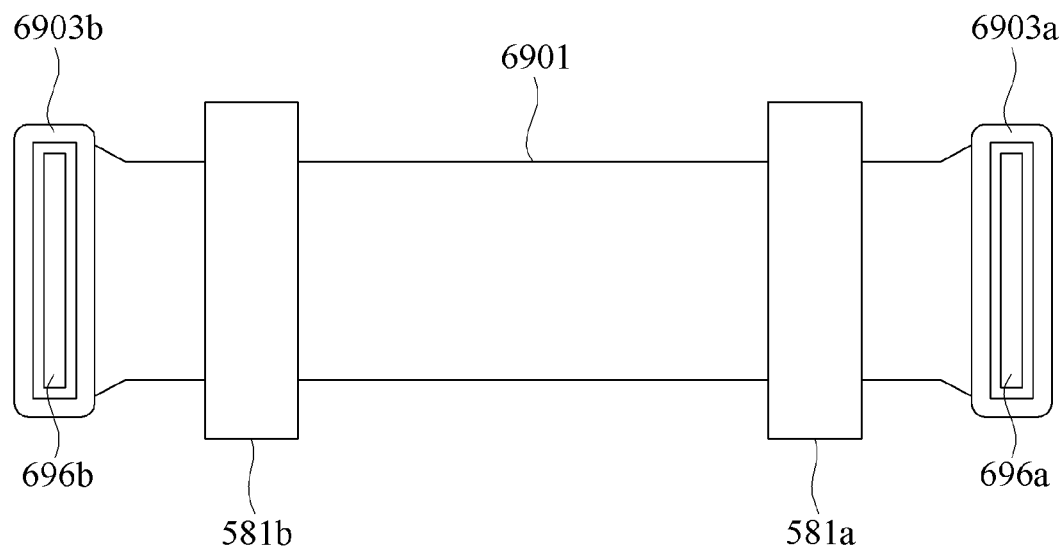
FIG. 6C is a rear view of an FPCB according to an embodiment of the disclosure.

FIG. 6A is a cross-sectional view of an FPCB according to an embodiment of the disclosure, FIG. 6B is a plan view of an FPCB according to an embodiment of the disclosure, and FIG. 6C is a rear view of an FPCB according to an embodiment of the disclosure.

FIGS. 6A to 6C show example configurations of the FPCB 590 shown in FIG. 5C. Referring to FIGS. 6A to 6C, the FPCB 590 may include a central portion 691, a first sealing portion 692a and a second sealing portion 692b respectively connected to both ends of the central portion 691, a first extension portion 693a extending in a direction opposite to the central portion 691 from the first sealing portion 692a, and a second extension portion 693b extending in a direction opposite to the central portion 691 form the second sealing portion 692b. In an embodiment, a first connecting terminal 696a may be connected to an end of the first extension portion 693a, and a second connecting terminal 696b may be connected to an end of the second extension portion 693b.

In an embodiment, the FPCB 590 may be formed in a multi-layer structure in which a plurality of layers is stacked. In an embodiment, the FPCB 590 may include a first layer 6901 and a second layer 6902 that extend from the first extension portion 693a to the second extension portion 693b in an extension direction (e.g., an X-axis direction of FIG. 6A). In an embodiment, a metal pattern for transmitting a signal along the extension direction may be formed on the first layer 6901 and the second layer 6902. In an embodiment, the second layer 6902 may be stacked in a first direction D1 (e.g., a +Z-axis direction of FIG. 6A) with respect to the first layer 6901.

In an embodiment, the FPCB 590 may further include reinforcing layers 6944a, 6944b, 6945a, and 6945b disposed on the first sealing portion 692a and the second sealing portion 692b. For example, first reinforcing layers 6944a and 6944b stacked on the first layer 6901 in a second direction D2 or second reinforcing layers 6945a and 6945b stacked on the second layer 6902 in a first direction D1 may be further arranged on the first sealing portion 692a and the second sealing portion 692b of the FPCB 590, respectively. The first reinforcing layers 6944a and 6944b and the second reinforcing layers 6945a and 6945b may improve the rigidity of the sealing portions (e.g., 692a and 692b), and may thereby secure the sealing portions (e.g., 692a and 692b) to brackets (e.g., the brackets 531 and 532 of FIG. 5C) more stably.

In an embodiment, the FPCB 590 may further include a reinforcing layer that is stacked on an extension portion to which the first connecting terminal 696a or the second connecting terminal 696b is connected. For example, third reinforcing layers 6904a and 6904b stacked on the first layer 6901 in the second direction D2 or fourth reinforcing layers 6903a and 6903b stacked on the second layer 6902 in the first direction D1 may be further arranged at an end of the first extension portion 693a in which the first connecting terminal 696a is disposed and an end of the second extension portion 693b in which the second connecting terminal 696b is disposed, respectively. The third reinforcing layers 6904a and 6904b and the fourth reinforcing layers 6903a and 6903b may improve the rigidity of the extension portions in which the connecting terminals 696a and 696b are disposed.

In an embodiment, the first cover member 581a for covering a first opening (e.g., the first opening 531a of FIG. 5C) may be connected to the first sealing portion 692a, and the second cover member 581b for covering a second opening (e.g., the second opening 532a of FIG. 5C) may be connected to the second sealing portion 692b. In this case, the second reinforcing layers 6945a and 6945b may be disposed between the second layer 6902 and the cover members 581a and 581b. In an embodiment, the first spacer 582a may have a thickness substantially corresponding to a thickness of the first sealing portion 692a, for example, a stacked thickness formed by the first layer 6901, the second layer 6902, the first reinforcing layer 6944a, and the second reinforcing layer 6945a of FIG. 6A. The second spacer 582b may have a thickness substantially corresponding to a thickness substantially corresponding to a thickness of the second sealing portion 692b. For example, a spacer (e.g., the spacers 582a and 582b) may have a thickness corresponding to a thickness of a sealing portion including a reinforcing layer.

In an embodiment, a first waterproof member 680a may be connected to the first sealing portion 692a and the first spacer 582a, and a second waterproof member 680b may be connected to the second sealing portion 692b and the second spacer 582b. For example, the first waterproof member 680a may be connected to the first reinforcing layer 6944a disposed on the first sealing portion 692a in the second direction D2, and the second waterproof member 680b may be connected to the first reinforcing layer 6944b disposed on the second sealing portion 692b in the second direction D2. In an embodiment, the first waterproof member 680a may include a first connecting area 6801 connected to the first spacer 582a and a second connecting area 6802 connected to the first sealing portion 692a. In this case, the first waterproof member 680a may connect a first bracket (e.g., the first bracket 531 of FIG. 5C) and the first spacer 582a through the first connecting area 6801, and may connect the first bracket and the first sealing portion 692a through the second connecting area 6802. In an embodiment, the second waterproof member 680b may include a third connecting area 6803 connected to the second spacer 582b and a fourth connecting area 6804 connected to the second sealing portion 692b. In this case, the second waterproof member 680b may connect a second bracket (e.g., the second bracket 532 of FIG. 5C) and the second spacer 582b through the third connecting area 6803, and may connect the second bracket and the second sealing portion 692b through the fourth connecting area 6804.

Figure 7A:
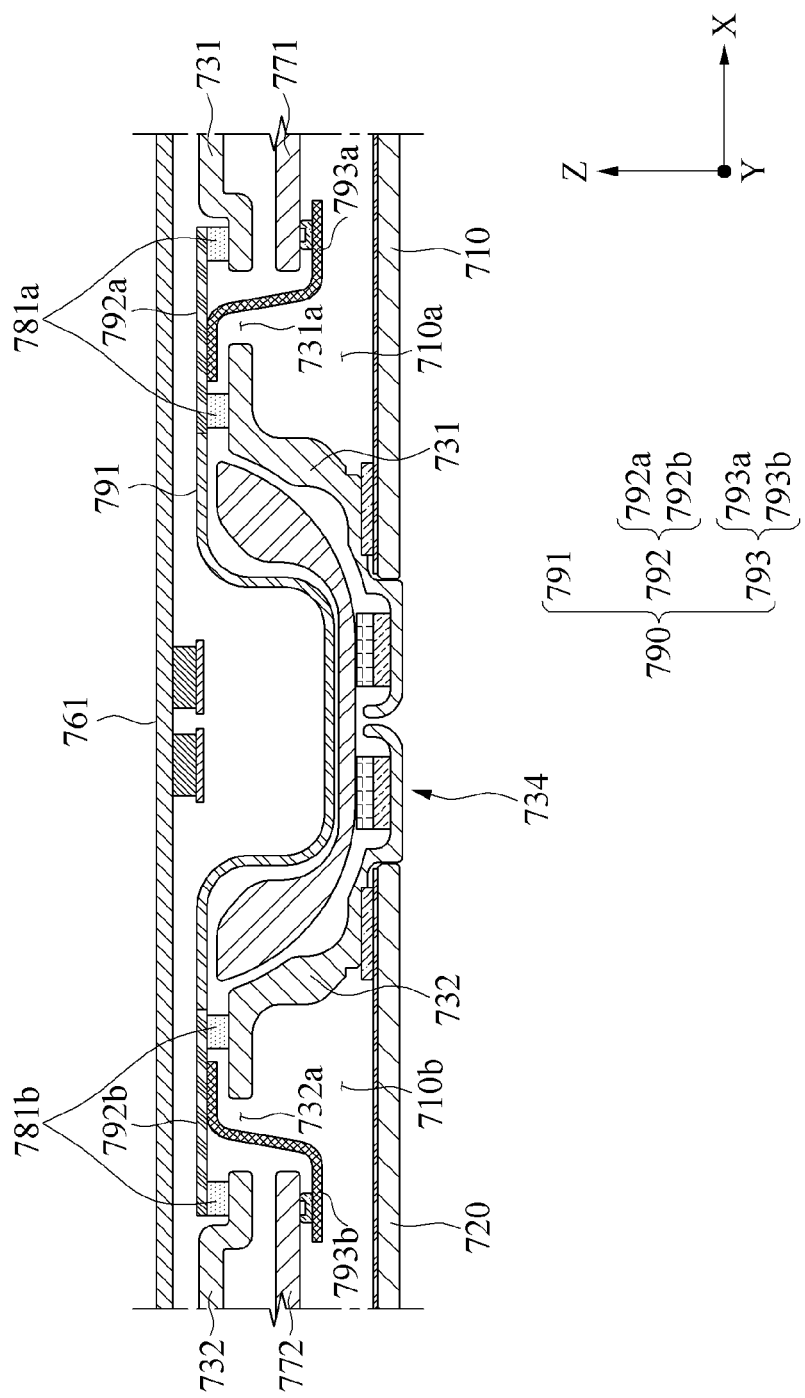
FIG. 7A is a cross-sectional view of an electronic device according to an embodiment of the disclosure.
Figure 7B:
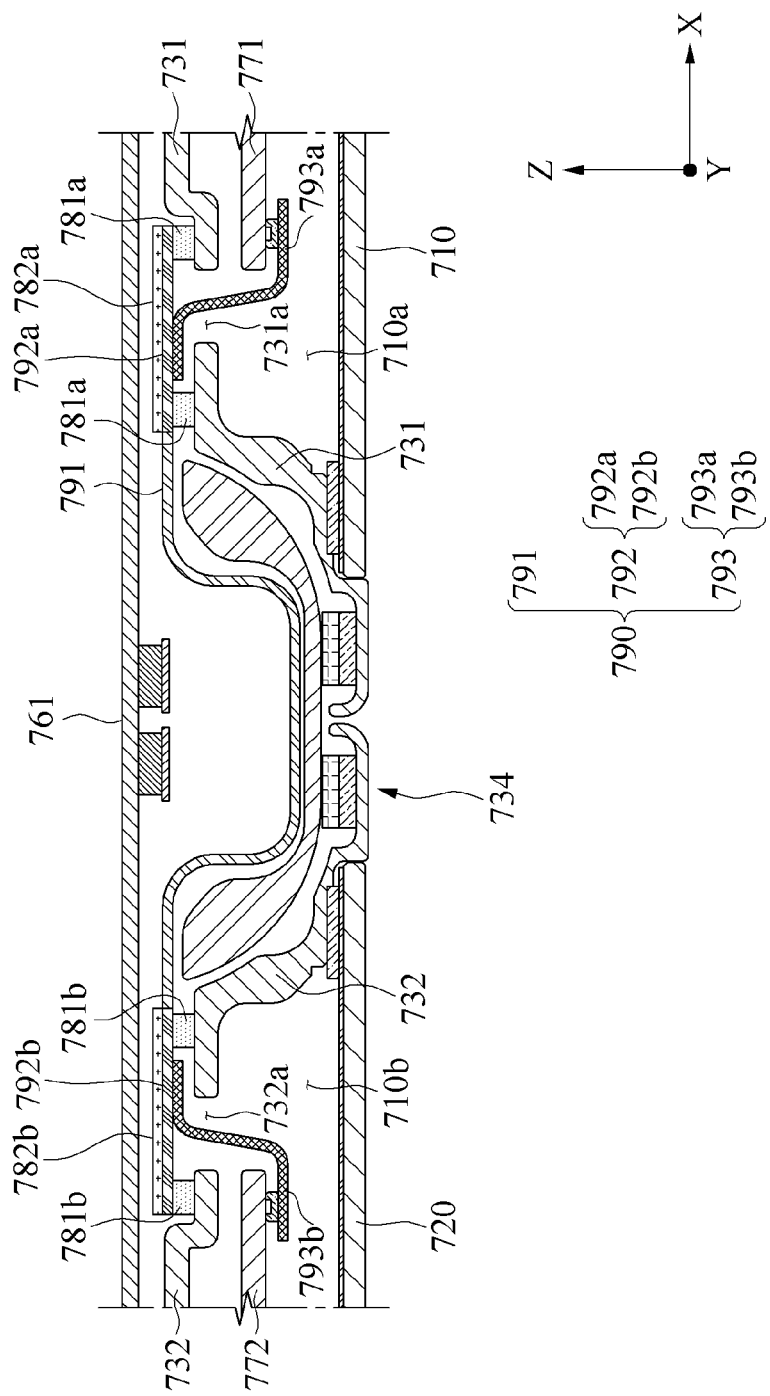
FIG. 7B is a cross-sectional view of an electronic device according to an embodiment of the disclosure.

FIG. 7A is a cross-sectional view of an electronic device according to an embodiment of the disclosure, and FIG. 7B is a cross-sectional view of an electronic device according to an embodiment of the disclosure.

Referring to FIGS. 7A and 7B, an electronic device (e.g., the electronic device 101 of FIG. 1 or the electronic device 201 of FIG. 2A) may include a display 761, a first housing 710, a second housing 720, a hinge structure 734, a first bracket 731, a second bracket 732, a first PCB 771, a second PCB 772, and an FPCB 790.

In an embodiment, the display 761 may be deformed in a shape as at least a portion thereof is bent by an operation of the electronic device. In an embodiment, the first housing 710 and the second housing 720 may support different areas of the display 761. The first housing 710 and the second housing 720 may be rotatably connected to the hinge structure 734. In an embodiment, the first bracket 731 may connect the first housing 710 and the hinge structure 734, and the second bracket 732 may connect the second housing 720 and the hinge structure 734. In an embodiment, the first housing 710 may form a first space 710a at a position opposite to the display 761 with respect to the first bracket 731, and the second housing 720 may form a second space 710b at a position opposite to the display 761 with respect to the second bracket 732. In an embodiment, the first PCB 771 may be disposed in the first space 710a, and the second PCB 772 may be disposed in the second space 710b.

In an example embodiment, the FPCB 790 may connect the first PCB 771 and the second PCB 772. The FPCB 790 may include a central portion 791, a sealing portion 792 (e.g., first sealing portion 792a and second sealing portion 792b), and an extension portion 793 (e.g., first extension portion 793a and second extension portion 793b).

In an embodiment, at least a portion of the central portion 791 may be disposed between the display 761 and the hinge structure 734, and both ends of the central portion 791 may extend to the first bracket 731 and the second bracket 732, respectively. In an embodiment, the first sealing portion 792a may be connected to the central portion 791, and may be disposed on a surface of the first bracket 731 to cover a first opening 731a. The second sealing portion 792b may be connected to the central portion 791 to be opposite to the first sealing portion 792a, and may be disposed on a surface of the second bracket 732 to cover a second opening 732a. In an embodiment, the first sealing portion 792a may be connected to the first bracket 731 through a first waterproof member 781a, and the second sealing portion 792b may be connected to the second bracket 732 through a second waterproof member 781b. In this case, the first waterproof member 781a may connect the first sealing portion 792a and the first bracket 731 to form a closed loop along a circumference of the first opening 731a, and the second waterproof member 781b may connect the second sealing portion 792b and the second bracket 732 to form a closed loop along a circumference of the second opening 732a.

In an embodiment, the first extension portion 793a may be connected to the first sealing portion 792a, and may extend to the first space 710a to be connected to the first PCB 771. The second extension portion 793b may be connected to the second sealing portion 792b, and may extend to the second space 710b to be connected to the second PCB 772. In an embodiment, the first extension portion 793a may be connected to a surface of the first sealing portion 792a exposed through the first opening 731a, and the second extension portion 793b may be connected to a surface of the second sealing portion 792b exposed through the second opening 732a. Thus, a sealing portion may be stably connected to a bracket without interference with an extension portion.

In an embodiment, referring to FIG. 7B, a first fixing member 782a may be connected to the first sealing portion 792a, and a second fixing member 782b may be connected to the second sealing portion 792b. In an embodiment, based on a state in which the display 761 is viewed, for example, viewed with respect to a −Z axis of FIG. 7B, the first fixing member 782a may be fixed to the first bracket 731 to cover the first sealing portion 792a, and the second fixing member 782b may be fixed to the second bracket 732 to cover the second sealing portion 792b. The first fixing member 782a and the second fixing member 782b may be formed of a metal material, for example, stainless steel (STS). The first sealing portion 792a and the second sealing portion 792b of the FPCB 790 may be stably fixed to the first bracket 731 and the second bracket 732 through the first fixing member 782a and the second fixing member 782b.

According to an embodiment, an electronic device (e.g., the electronic device 301) may include: a display (e.g., display 361) including a first area (e.g., first area 361a) and a second area (e.g., second area 361b); a first housing (e.g., first housing 310) supporting the first area 361a and forming a first space (e.g., first space 310a) disposed on a rear surface of the first area 361a; a second housing (e.g., second housing 320) supporting the second area 361b and forming a second space (e.g., second space 310b) disposed on a rear surface of the second area 361b; a hinge structure (e.g., hinge structure 334) connecting the first housing 310 and the second housing 320 to be foldable about a folding axis and allowing the first area 361a and the second area 361b to change between a first state of forming substantially the same plane and a second state of facing each other; a first bracket (e.g., first bracket 331) connecting the first housing 310 and the hinge structure 334 and having a first opening (e.g., first opening 331a) penetrating through a surface thereof; a second bracket (e.g., second bracket 332) connecting the second housing 320 and the hinge structure 334 and having a second opening (e.g., second opening 332a) penetrating through a surface thereof; and an FPCB (e.g., FPCB 390) extending from the first space 310a to the second space 310b across the folding axis in an extension direction. The FPCB 390 may include: a central portion (e.g., central portion 391) of which at least a portion is disposed in the hinge structure 334, first and second ends of the central portion extending the first bracket 331 and the second bracket 332, respectively; a first sealing portion (e.g., first sealing portion 392a) disposed on a surface of the first bracket 331 and covering the first opening 331a; a second sealing portion (e.g., second sealing portion 392b) disposed on a surface of the second bracket 332 and covering the second opening 332a; a first extension portion (e.g., first extension portion 393a) extending to the first space 310a through the first opening 331a; and a second extension portion (e.g., second extension portion 393b) extending to the second space 310b through the second opening 332a.

In an embodiment, the first sealing portion 392a is connected to the first bracket 331 along a circumference of the first opening 331a without interfering with the first extension portion 393a, and the second sealing portion 392b is connected to the second bracket 332 along a circumference of the second opening 332a without interfering with the second extension portion 393b.

In an embodiment, the first extension portion 393a is connected to a surface of the first sealing portion 392a exposed through the first opening 332a. The second extension portion 393b is connected to a surface of the second sealing portion 392b exposed through the second opening 332a.

In an embodiment, when viewing the display 361 in the first state, the first sealing portion 392a may be disposed on the surface of the first bracket 331 to cover the first opening 331a, and the second sealing portion 392b may be disposed on the surface of the second bracket 332 to cover the second opening 332a.

In an embodiment, the electronic device 301 may include a first waterproof member (e.g., first waterproof member 380a) disposed between the first bracket 331 and the first sealing portion 392a to surrounding a circumference of the first opening 331a, and a second waterproof member (e.g., second waterproof member 380b) disposed between the second bracket 332 and the second sealing portion 392b to surrounding a circumference of the second opening 332a.

In an embodiment, based on a width perpendicular to the extension direction, a width of the first sealing portion 392a and the second sealing portion 392b may be greater than that of the central portion 391.

In an embodiment, the rigidity of the first sealing portion 392a and the second sealing portion 392b may be greater than that of the central portion 391.

In an embodiment, the electronic device 301 may further include a first fixing member (e.g., first fixing member 782a) disposed to cover the first sealing portion (e.g., first sealing portion 792a) and fixed to the first bracket (e.g., first bracket 731), and a second fixing member (e.g., second fixing member 782b) disposed to cover the second sealing portion (e.g., second sealing portion 792b) and fixed to the second bracket (e.g., second bracket 732), when viewing the display 761 in the first state.

In an embodiment, the FPCB 390 may include a base member (e.g., base member 4900) forming the central portion 391, the first sealing portion 392a, and the second sealing portion 392b; a first connection member (e.g., first connection member 494) connected to the base member 4900 at least partially overlappingly and forming the first extension portion 393a; and a second connection member (e.g., second connection member 495) connected to the base member 4900 at least partially overlappingly and forming the second extension portion 393b.

In an embodiment, the first connection member 494 may be connected to a portion of the first sealing portion 392a overlapping the first opening 331a, and the second connection member 495 may be connected to a portion of the second sealing portion 392b overlapping the second opening 332a.

In an embodiment, the base member 4900 may include a first layer (e.g., first layer 4901), and a second layer (e.g., second layer 4902) stacked in a first direction D1 toward the display 361 with respect to the first layer 4901, when the display 361 is in the first state. Based on the first state, each of the first connection member 494 and the second connection member 495 may be connected in a second direction D2 opposite to the first direction D1 with respect to the first layer 4901, when the display 361 is in the first state.

In an embodiment, the base member 4900 may further include a third layer 4903a stacked in the first direction D1 on a portion of the second layer 4902 forming the first sealing portion 392a; and a fourth layer (e.g., fourth layer 4903b) stacked in the first direction D1 on a portion of the second layer 4902 forming the second sealing portion 392b, when viewing the display 361 in the first state.

In an embodiment, each of the first connection member 494 and the second connection member 495 may further include a first connecting layer (e.g., first connecting layers 4941 and 4951) stacked on the first layer 4901 in the second direction D2; and a second connecting layer (e.g., second connecting layers 4942 and 4952) stacked on the first connecting layers 4941 and 4951 in the second direction D2.

In an embodiment, the first connection member 494 may include a first connecting portion to which a first connecting terminal (e.g., first connecting terminal 496a) is connected, and the second connection member 495 may include a second connecting area to which a second connecting terminal (e.g., second connecting terminal 496b) is connected. The first connection member 494 and the second connection member 495 may further include third connecting layers (e.g., third connecting layers 4943 and 4953), respectively, that are stacked in the second direction D2 on respective portions of the second connecting layers 4942 and 4952 forming the first connecting portion and the second connection portion, respectively.

In an embodiment, when viewing the display 361 in the first state, the first connection member 494 and the second connection member 495 of the electronic device 301 may further include fourth connecting layers (e.g., fourth connecting layers 4944 and 4954), respectively, that are stacked in the second direction D2 on the second connecting layers 4942 and 4952 to overlap the base member 4900.

In an embodiment, the electronic device (e.g., the electronic device 501) may further include a first cover member (e.g., first cover member 591a) connected to the first sealing portion (e.g., first sealing portion 592a) and disposed on a surface of the first bracket (e.g., first bracket 531) to cover the first opening (e.g., first opening 531a); a second cover member (e.g., second cover member 591b) connected to the second sealing portion (e.g. second sealing portion 592b) and disposed on a surface of the second bracket (e.g., second bracket 532) to cover the second opening (e.g., second opening 532a); a first spacer (e.g., first spacer 582a) connecting the first cover member 591a and the second bracket 532; and a second spacer (e.g., second spacer 582b) connecting the second cover member 591b and the second bracket 532.

In an embodiment, when viewing the display 361 in the first state, the first spacer 582a and the first sealing portion 592a may form a closed loop surrounding a circumference of the first opening 531a, and the second spacer 582b and the second sealing portion 592b may form a closed loop surrounding a circumference of the second opening 532a.

According to an embodiment, an electronic device (e.g., the electronic device 501) may include: a display (e.g., display 561) including a first area (e.g., first area 561a) and a second area (e.g., second area 561b); a first housing (e.g., first housing 510) supporting the first area 561a and forming a first space (e.g., first space 510a) disposed on a rear surface of the first area 561a; a second housing (e.g., second housing 520) supporting the second area 561b and forming a second space (e.g., second space 510b) disposed on a rear surface of the second area 561b; a hinge structure (e.g., hinge structure 534) connecting the first housing 510 and the second housing 520 to be foldable about a folding axis and allowing the first area 561a and the second area 561b to change between a first state of forming substantially the same plane and a second state of facing each other; a first bracket (e.g., first bracket 531) connecting the first housing 510 and the hinge structure 534 and having a first opening (e.g., first opening 531a) penetrating through a surface thereof; a second bracket (e.g., second bracket 532) connecting the second housing 520 and the hinge structure 534 and having a second opening (e.g., second opening 532a) penetrating through a surface thereof; and an FPCB (e.g., FPCB 590) of which at least a portion is disposed between the hinge structure 534 and the display 561 and first and second ends pass through the first opening 531a and the second opening 532a to extend to the first space 510a and the second space 510b, respectively; a first cover member (e.g., first cover member 591a) connected to a first sealing portion (e.g., first sealing portion 592a) of the FPCB 590 and disposed between the display 561 and the first bracket 531 to cover the first opening 531a; and a second cover member (e.g., second cover member 591b) connected to a second sealing portion (e.g., second sealing portion 592b) of the FPCB 590 and disposed between the display 561 and the second bracket 532 to cover the second opening 532a.

In an embodiment, the electronic device 501 may further include a first spacer (e.g., first spacer 582a) connecting the first cover member 591a and the first bracket 531; and a second spacer (e.g., second spacer 582b) connecting the second cover member 591b and the second bracket 532. When viewing the display 561 in the first state, the first spacer 582a and the first sealing portion 592a may form a closed loop surrounding a circumference of the first opening 531a, and the second spacer 582b and the second sealing portion 592b may form a closed loop surrounding a circumference of the second opening 532a.

In an embodiment, the first spacer 582a may have substantially the same thickness as that of the first sealing portion 592a, and the second spacer 582b may have substantially the same thickness as that of the second sealing portion 592b.

In an embodiment, the electronic device (e.g., the electronic device 301) may further include a first waterproof member (e.g., first waterproof member 380a) forming a closed loop along a circumference of the first opening (e.g., first opening 331a) and including a first connecting area (e.g., first connecting area 6801) connecting the first sealing portion (e.g., first sealing portion 392a) and the first bracket (e.g., first bracket 331) and a second connecting area (e.g., second connecting area 6802) connecting the first spacer (e.g., first spacer 582a) and the first bracket 331; and the second waterproof member (e.g., second waterproof member 380b) forming a closed loop along a circumference of the second opening (e.g., second opening 332a) and including a third connecting area (e.g., third connecting area 6803) connecting the second sealing portion (e.g., second sealing portion 392*b*) and the second bracket (e.g., second bracket 332) and a fourth connecting area 6804 connecting the second spacer (e.g., second spacer 582*b*) and the second bracket 332.

According to an embodiment, an electronic device (e.g., the electronic device 301) may include: a display (e.g., display 361) including a first area (e.g., first area 361*a*) and a second area (e.g., second area 361*b*); a first housing (e.g., first housing 310) including a first surface on which the first area 361*a* is disposed and a second surface opposite to the first surface; a second housing (e.g., second housing 320) including a third surface on which the second area 361*b* is disposed and a fourth surface opposite to the third surface; a hinge structure (e.g., hinge structure 334) connecting the first housing 310 and the second housing 320 to be foldable about a folding axis and allowing the first area 361*a* and the second area 361*b* to change between a first state of forming substantially the same plane and a second state of facing each other; a first bracket (e.g., first bracket 331) connecting the first housing 310 and the hinge structure 334 and including a first opening (e.g., first opening 331*a*) penetrating through a surface thereof; a second bracket (e.g., second bracket 332) connecting the second housing 320 and the hinge structure 334 and including a second opening (e.g., second opening 332*a*) penetrating through a surface thereof; a first PCB (e.g., first PCB 371) disposed between the first bracket 331 and the second surface; a second PCB (e.g., second PCB 372) disposed between the second bracket 332 and the fourth surface; and an FPCB (e.g., FPCB 390) connecting the first PCB 371 and the second PCB 372. When viewing the display 361 in the first state, the FPCB 390 may include: a base member (e.g., base member 4900) including a central portion (e.g., central portion 391) of which at least a portion is disposed between the hinge structure 334 and the display 361, a first sealing member (e.g., first sealing portion 392*a*) connected to the central portion 391 and disposed on the surface of the first bracket 331 to cover the first opening 331*a*, and a second sealing portion (e.g., second sealing portion 392*b*) connected to the central portion 391 to be opposite to the first sealing portion 392*a* and disposed on the second bracket 332 to cover the second opening 332*a*; a first connection member (e.g., first connection member 494) connected to the first sealing portion 392*a* and connected to the first PCB 371 through the first opening 331*a*; and a second connection member (e.g., second connection member 495) connected to the second sealing portion 392*b* and connected to the second PCB 372 through the second opening 332*a*.

In an embodiment, the first sealing portion 392*a* and the second sealing portion 392*b* have a greater number of layers that are stacked than the central portion 391.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
a display comprising a first area and a second area;
a first housing supporting the first area and forming a first space on a rear surface of the first area;
a second housing supporting the second area and forming a second space on a rear surface of the second area;
a hinge structure connecting the first housing and the second housing to be foldable about a folding axis and allowing the first area and the second area to change between a first state in which the first area and the second area form substantially a same plane and a second state in which the first area and the second area face each other;
a first bracket connecting the first housing and the hinge structure and having a first opening penetrating through a surface thereof;
a second bracket connecting the second housing and the hinge structure and having a second opening penetrating through a surface thereof; and
a flexible printed circuit board (FPCB) extending from the first space to the second space across the folding axis in an extension direction,
wherein the FPCB comprises:
a central portion of which at least a portion is arranged on the hinge structure, first and second ends of the central portion extending to the first bracket and the second bracket, respectively;
a first sealing portion connected to the surface of the first bracket and sealing the first opening;
a second sealing portion connected to the surface of the second bracket and sealing the second opening;
a first extension portion extending to the first space through the first opening; and
a second extension portion extending to the second space through the second opening.

2. The electronic device of claim 1,
wherein the first sealing portion is connected to the first bracket along a circumference of the first opening without interfering with the first extension portion, and
wherein the second sealing portion is connected to the second bracket along a circumference of the second opening without interfering with the second extension portion.

3. The electronic device of claim 1,
wherein the first extension portion is connected to a surface of the first sealing portion exposed through the first opening, and
wherein the second extension portion is connected to a surface of the second sealing portion exposed through the second opening.

4. The electronic device of claim 1, wherein, the first sealing portion is arranged on the surface of the first bracket and covers the first opening and the second sealing portion is arranged on the surface of the second bracket and covers the second opening.

5. The electronic device of claim 4, further comprising:
a first waterproof member disposed between the first bracket and the first sealing portion and surrounding a circumference of the first opening; and
a second waterproof member disposed between the second bracket and the second sealing portion and surrounding a circumference of the second opening.

6. The electronic device of claim 4, wherein, based on a width perpendicular to the extension direction, a width of the first sealing portion and the second sealing portion is greater than a width of the central portion.

7. The electronic device of claim 4, wherein a rigidity of the first sealing portion and the second sealing portion is greater than a rigidity of the central portion.

8. The electronic device of claim 4, further comprising:
a first fixing member arranged to cover the first sealing portion, and being fixed to the first bracket; and a second fixing member arranged to cover the second sealing portion, and being fixed to the second bracket.

9. The electronic device of claim 4, wherein the FPCB further comprises:
a base member forming the central portion, the first sealing portion, and the second sealing portion;
a first connection member connected to the base member and at least partially overlapping the base member, the first connection member forming the first extension portion; and
a second connection member connected to the base member and at least partially overlapping the base member, the second connection member forming the second extension portion.

10. The electronic device of claim 9, wherein the first connection member is connected to a portion of the first sealing portion overlapping the first opening and the second connection member is connected to a portion of the second sealing portion overlapping the second opening.

11. The electronic device of claim 9,
wherein the base member comprises:
a first layer; and
a second layer stacked in a first direction toward the display with respect to the first layer, when the display is in the first state, and
wherein each of the first connection member and the second connection member is connected in a second direction opposite to the first direction with respect to the first layer, when the display is in the first state.

12. The electronic device of claim 11, wherein the base member further comprises:
a third layer stacked in the first direction, when the display is in the first state, on a portion of the second layer forming the first sealing portion; and
a fourth layer stacked in the first direction, when the display is in the first state, on a portion of the second layer forming the second sealing portion.

13. The electronic device of claim 11, wherein each of the first connection member and the second connection member comprises:
a first connecting layer stacked on the first layer in the second direction; and
a second connecting layer stacked on the first connecting layer in the second direction.

14. The electronic device of claim 13,
wherein the first connection member further comprises a first connecting portion to which a first connecting terminal is connected,
wherein the second connection member further comprises a second connecting portion to which a second connecting terminal is connected, and
wherein each of the first connection member and the second connection member further comprises a third connecting layer stacked in the second direction on a portion of the second connecting layer forming the first connecting portion and the second connecting portion.

15. The electronic device of claim 13, wherein each of the first connection member and the second connection member further comprises a fourth connecting layer stacked in the second direction on the second connecting layer and overlapping the base member, when the display is in the first state.

16. An electronic device comprising:
a display comprising a first area and a second area;
a first housing supporting the first area and forming a first space on a rear surface of the first area;
a second housing supporting the second area and forming a second space on a rear surface of the second area;
a hinge structure connecting the first housing and the second housing to be foldable about a folding axis and allowing the first area and the second area to change between a first state in which the first area and the second area form substantially a same plane and a second state in which the first area and the second area face each other;
a first bracket connecting the first housing and the hinge structure and having a first opening penetrating through a surface thereof,
a second bracket connecting the second housing and the hinge structure and having a second opening penetrating through a surface thereof;
a flexible printed circuit board (FPCB) of which at least a portion is arranged between the hinge structure and the display, first and second ends of the FPCB extending to the first space and the second space through the first opening and the second opening, respectively;
a first cover member connected to a first sealing portion of the FPCB, the first cover member being arranged between the display and the first bracket and covering the first opening; and
a second cover member connected to a second sealing portion of the FPCB, the second cover member being arranged between the display and the second bracket and covering the second opening.

17. The electronic device of claim 16, further comprising:
a first spacer connecting the first cover member and the first bracket; and
a second spacer connecting the second cover member and the second bracket,
wherein the first spacer and the first sealing portion form a closed loop surrounding a circumference of the first opening, and the second spacer and the second sealing portion form a closed loop surrounding a circumference of the second opening.

18. The electronic device of claim 17,
wherein the first spacer has substantially a same thickness as the first sealing portion, and
wherein the second spacer has substantially a same thickness as the second sealing portion.

19. The electronic device of claim 17, further comprising:
a first waterproof member forming a closed loop along the circumference of the first opening, the first waterproof member comprising a first connecting area connecting the first sealing portion and the first bracket and a second connecting area connecting the first spacer and the first bracket; and
a second waterproof member forming a closed loop along the circumference of the second opening, the second waterproof member comprising a third connecting area connecting the second sealing portion and the second bracket and a fourth connecting area connecting the second spacer and the second bracket.

20. An electronic device, comprising:
a display comprising a first area and a second area;
a first housing comprising a first surface on which the first area is arranged and a second surface opposite to the first surface;
a second housing comprising a third surface on which the second area is arranged and a fourth surface opposite to the third surface;
a hinge structure connecting the first housing and the second housing to be foldable about a folding axis and allowing the first area and the second area to change between a first state in which the first area and the second area form substantially a same plane and a second state in which the first area and the second area face each other;
a first bracket connecting the first housing and the hinge structure and comprising a first opening penetrating through a surface thereof;
a second bracket connecting the second housing and the hinge structure and comprising a second opening penetrating through a surface thereof;
a first printed circuit board (PCB) arranged between the first bracket and the second surface;
a second PCB arranged between the second bracket and the fourth surface;
a flexible PCB (FPCB) connecting the first PCB and the second PCB, wherein the FPCB comprises:
  a base member comprising a central portion of which at least a portion is arranged between the hinge structure and the display, when the display is in the first state,
  a first sealing portion connected to the central portion, the first sealing portion being arranged on the surface of the first bracket and covering the first opening, when the display is in the first state, and
  a second sealing portion connected to the central portion to be opposite to the first sealing portion, the second sealing portion being arranged on the surface of the second bracket and covering the second opening, when the display is in the first state;
a first connection member connected to the first sealing portion and connected to the first PCB through the first opening; and
a second connection member connected to the second sealing portion and the second PCB through the second opening.

* * * * *